United States Patent
Fukunaga

(10) Patent No.: US 6,690,698 B2
(45) Date of Patent: Feb. 10, 2004

(54) SEMICONDUCTOR LASER DEVICE INCLUDING ARROW STRUCTURE PRECISELY FORMED TO SUPPRESS P-AS INTERDIFFUSION AND AL OXIDATION

(75) Inventor: Toshiaki Fukunaga, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/328,011

(22) Filed: Dec. 26, 2002

(65) Prior Publication Data

US 2003/0128731 A1 Jul. 10, 2003

(30) Foreign Application Priority Data

Dec. 25, 2001 (JP) ..................... 2001-390925
Jan. 2, 2002 (JP) ..................... 2002/025389

(51) Int. Cl.[7] ............................... H01S 5/20
(52) U.S. Cl. ........................... 372/43; 372/45
(58) Field of Search ..................... 372/43, 45

(56) References Cited

U.S. PATENT DOCUMENTS 5,386,428 A * 1/1995 Thornton et al. ............. 372/50
5,563,094 A * 10/1996 Paoli et al. ................... 438/32
5,585,957 A * 12/1996 Nakao et al. ................ 359/248
5,606,570 A   2/1997 Botez et al.
2002/0037022 A1 * 3/2002 Fukagai ....................... 372/46
2002/0122615 A1 * 9/2002 Painter et al. ................ 385/15

* cited by examiner

Primary Examiner—Paul Ip
Assistant Examiner—Jeffrey N Zahn
(74) Attorney, Agent, or Firm—Sughrue Mion, PLLC

(57) ABSTRACT

In a semiconductor laser element: an n-type cladding layer, an undoped or n-type optical waveguide layer, an $In_{x3}Ga_{1-x3}As_{1-y3}P_{y3}$ quantum-well active layer, and an undoped or p-type optical waveguide layer are formed on an n-type GaAs substrate; a first etching stop layer and an n-type first current confinement layer are formed corresponding to high-refractive-index regions realizing an ARROW structure; a second etching stop layer and an n-type second current confinement layer are formed with an opening for current injection; and a p-type cladding layer and a p-type GaAs contact layer are formed over the entire upper surface. For example, the compositions of the cladding layers, the optical waveguide layers, the first etching stop layer, the first current confinement layer, the second etching stop layer, and the second current confinement layer are $In_{0.49}Ga_{0.51}P$ (or $Al_{z1}Ga_{1-z1}As$), GaAs, p-type $In_{x8}Ga_{1-x8}P$, GaAs, n-type or p-type $In_{x8}Ga_{1-x8}P$, and $Al_{z1}Ga_{1-z1}As$, respectively.

18 Claims, 12 Drawing Sheets

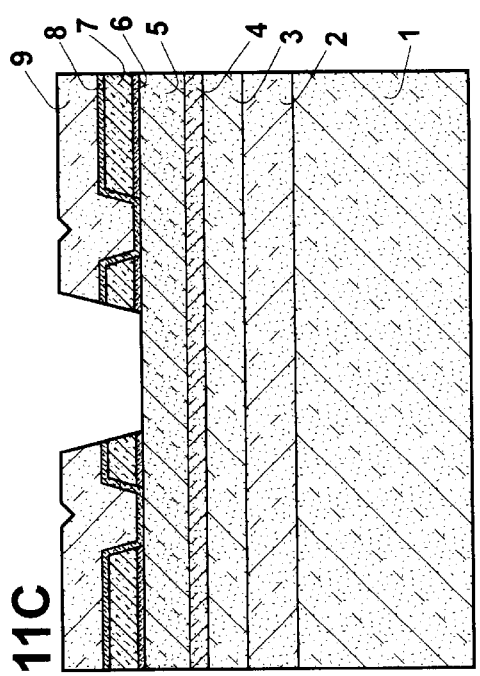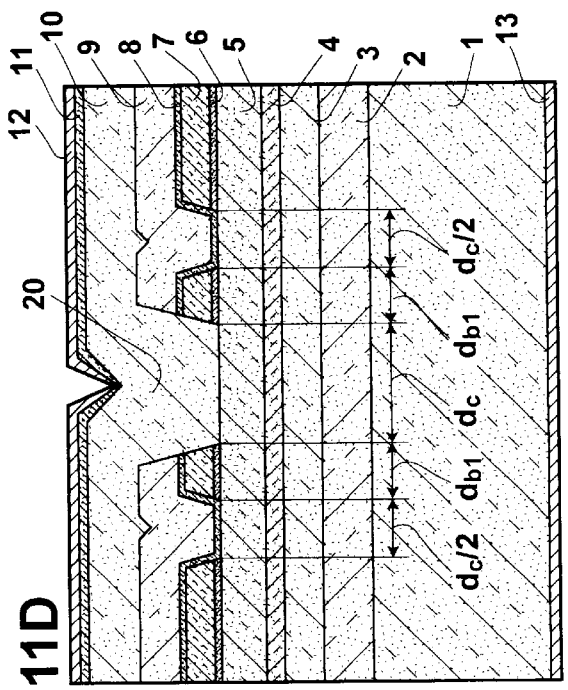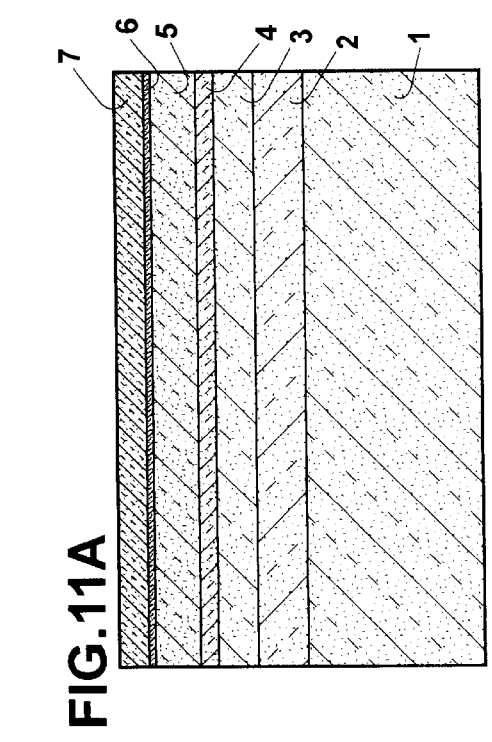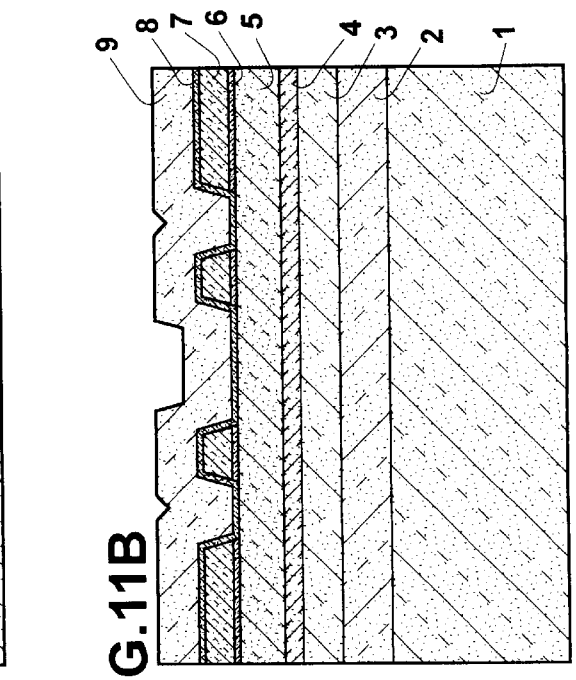
FIG.11A
FIG.11B
FIG.11C
FIG.11D

SEMICONDUCTOR LASER DEVICE INCLUDING ARROW STRUCTURE PRECISELY FORMED TO SUPPRESS P-AS INTERDIFFUSION AND AL OXIDATION

BACKGROUND OF THE INVENTION

1. Field of the Invention

The present invention relates to a semiconductor laser element including an ARROW (Antiresonant Reflecting Optical Waveguide) structure. In particular, the present invention relates to a semiconductor laser element including an ARROW structure and emitting laser light in the 980 nm band.

2. Description of the Related Art

A reliable high-power semiconductor laser element which emits a high-quality, diffraction-limited beam is required for use as a light source in exciting an optical fiber amplifier.

U.S. Pat. No. 5,606,570 discloses a semiconductor laser element having an ARROW structure as a semiconductor laser element which can emit a high-output-power, diffraction-limited laser beam in the 980 nm band. The disclosed semiconductor laser element includes an InGaAs active layer and an InGaAlP current confinement layer, and uses GaAs as a medium having a high refractive index. The ARROW structure is a structure for confining light in core regions. The disclosed ARROW structure includes a plurality of core regions having a low equivalent (effective) refractive index, first high-refractive-index regions which have a high equivalent refractive index and are arranged between the plurality of core regions and on the outer sides of the plurality of core regions, low-refractive-index regions which have an equivalent refractive index approximately identical to that of the plurality of core regions and are arranged on the outer sides of the outermost ones of the high-refractive-index regions, and second high-refractive-index regions which have a high equivalent refractive index and are arranged on the outer sides of the low-refractive-index regions. The first high-refractive-index regions behave as reflectors of light in the fundamental transverse mode, and the low-refractive-index regions suppress leakage of light. Thus, the semiconductor laser element can be controlled so as to operate in the fundamental transverse mode.

It is reported that a preferable value of the width $d_{b1}'$ of each of the outermost ones of the first high-refractive-index regions is determined in accordance with the equation (1), a preferable value of the width $d_{b2}'$ of each of the first high-refractive-index regions arranged between the plurality of core regions is determined in accordance with the equation (2), and a preferable value of the width of each of the low-refractive-index regions is $d_c/2$, where $d_c'$ is the width of each of the plurality of core regions. In the equations (1) and (2), $\lambda$ is the oscillation wavelength, $n_c'$ is the equivalent refractive index of the plurality of core regions, and $n_b'$ is the equivalent refractive index of the first high-refractive-index regions.

$$d_{b1}' = \frac{(2m+1)\lambda}{4\left\{n_b'^2 - n_c'^2 + \left(\frac{\lambda}{2d_c'}\right)^2\right\}^{\frac{1}{2}}} \quad (1)$$

$$d_{b2}' = \frac{m\lambda}{2\left\{n_b'^2 - n_c'^2 + \left(\frac{\lambda}{2d_c'}\right)^2\right\}^{\frac{1}{2}}} \quad (2)$$

The semiconductor laser elements disclosed in U.S. Pat. No. 5,606,570 have a structure which requires a regrowth technique. According to the structure, InGaP, InAlP, or GaAs layers are exposed at the surface as a base of the regrowth at the time of the regrowth. Therefore, P-As interdiffusion occurs at the exposed surface during a process of raising temperature for the regrowth, and thus the regrowth is likely to become defective. As a result, the above semiconductor laser element is not practicable.

SUMMARY OF THE INVENTION

An object of the present invention is to provide a semiconductor laser element which includes an ARROW structure and is reliable in a wide output power range from low to high output power levels.

Another object of the present invention is to provide a process for producing a semiconductor laser element which includes an ARROW structure and is reliable in a wide output power range from low to high output power levels.

(1) According to the first aspect of the present invention, there is provided a semiconductor laser element comprising: a GaAs substrate of a first conductive type; a lower cladding layer formed above the GaAs substrate and made of $In_{0.49}Ga_{0.51}P$ or $Al_{z1}Ga_{1-z1}As$ of the first conductive type, where $0.2 \leq z1 \leq 0.8$; a lower optical waveguide layer formed above the lower cladding layer and made of GaAs which is undoped or the first conductive type; a compressive-strain quantum-well active layer formed above the lower optical waveguide layer and made of undoped $In_{x3}Ga_{1-x3}As_{1-y3}P_{y3}$ where $0.49y3 \leq x3 \leq 0.4$ and $0 \leq y3 \leq 0.1$; an upper optical waveguide layer formed above the compressive-strain quantum-well active layer and made of GaAs which is undoped or a second conductive type; a first etching stop layer made of $In_{x8}Ga_{1-x8}P$ of the second conductive type and formed above the upper optical waveguide layer other than stripe areas of the upper optical waveguide layer corresponding to at least one current injection region and low-refractive-index regions located on outer sides of the at least one current injection region and separated from the at least one current injection region or outermost ones of the at least one current injection region by a predetermined interval, where $0 \leq x8 \leq 1$, and the stripe areas extend in an oscillation direction of a laser resonator; a first current confinement layer made of GaAs of the first conductive type and formed above the first etching stop layer; a second etching stop layer made of $In_{x9}Ga_{1-x9}P$ of the first conductive type or the second conductive type and formed above the first current confinement layer and ones of the stripe areas of the upper optical waveguide layer corresponding to the low-refractive-index regions, where $0 \leq x9 \leq 1$; a second current confinement layer made of $Al_{z1}Ga_{1-z1}As$ of the first conductive type and formed above the second etching stop layer; an upper cladding layer made of $Al_{z1}Ga_{1-z1}As$ of the second conductive type and formed above the second current confinement layer and at least one of the stripe areas of the upper optical waveguide layer corresponding to the at least one current injection region; and a contact layer made of GaAs of the second conductive type and formed above the upper cladding layer.

Preferably, the semiconductor laser element according to the first aspect of the present invention may also have one or any possible combination of the following additional features (i) to (iv).

(i) The semiconductor laser element according to the first aspect of the present invention may further comprise a cap layer made of GaAs of the first conductive type or the second conductive type and formed on the second current confinement layer made of $Al_{z1}Ga_{1-z1}As$ of the first conductive type.

(ii) The semiconductor laser element according to the first aspect of the present invention may further comprise a GaAs layer of the second conductive type and formed between the first etching stop layer and the first current confinement layer, where the first etching stop layer is made of $In_{x8}Ga_{1-x8}P$ of the second conductive type, and the first current confinement layer is made of GaAs of the first conductive type.

(iii) The semiconductor laser element according to the first aspect of the present invention may further comprise an InGaAs quantum-well layer formed at a midthickness of the first current confinement layer, where the InGaAs quantum-well layer has a bandgap smaller than the bandgap of the active layer.

(iv) It is preferable that the width of each of the at least one current injection region is 3 micrometers or greater.

(2) According to the second aspect of the present invention, there is provided a process for producing a semiconductor laser element, comprising the steps of: (a) forming above a GaAs substrate of a first conductive type a lower cladding layer made of $In_{0.49}Ga_{0.51}P$ or $Al_{z1}Ga_{1-z1}As$ of the first conductive type, where $0.2 \leq z1 \leq 0.8$; (b) forming above the lower cladding layer a lower optical waveguide layer made of GaAs which is undoped or the first conductive type; (c) forming above the lower optical waveguide layer a compressive-strain quantum-well active layer made of undoped $In_{x3}Ga_{1-x3}As_{1-y3}P_{y3}$, where $0.49y3 < x3 \leq 0.4$ and $0 \leq y3 \leq 0.1$; (d) forming above the compressive-strain quantum-well active layer an upper optical waveguide layer made of GaAs which is undoped or a second conductive type; (e) forming above the upper optical waveguide layer a first etching stop layer made of $In_{x8}Ga_{1-x8}P$ of the second conductive type, where $0 \leq x8 \leq 1$; (f) forming above the first etching stop layer a first current confinement layer made of GaAs of the first conductive type; (g) removing stripe regions of the first current confinement layer and the first etching stop layer so as to expose first stripe areas of the upper optical waveguide layer, where the first stripe areas correspond to at least one current injection region and low-refractive-index regions located on outer sides of the at least one current injection region and separated from the at least one current injection region or outermost ones of the at least one current injection region by a predetermined interval, and the first stripe areas extend in an oscillation direction of a laser resonator; (h) raising temperature in an arsenic atmosphere; (i) forming a second etching stop layer made of $In_{x9}Ga_{1-x9}P$ of the first conductive type or the second conductive type by regrowth above remaining areas of the first current confinement layer and the first stripe areas of the upper optical waveguide layer, where $0 \leq x9 \leq 1$; (j) forming above the second etching stop layer a second current confinement layer made of $Al_{z1}Ga_{1-z1}As$ of the first conductive type; (k) removing stripe regions of the second current confinement layer and the second etching stop layer so as to expose at least one second stripe area of the upper optical waveguide layer, where the at least one second stripe area corresponds to the at least one current injection region, and the at least one second stripe area extends in the oscillation direction of the laser resonator; (l) raising the temperature in an arsenic atmosphere; (m) forming an upper cladding layer made of $Al_{z1}Ga_{1-z1}As$ of the second conductive type by regrowth above remaining areas of the second current confinement layer and the at least one second stripe area of the upper optical waveguide layer; and (n) forming above the upper cladding layer a contact layer made of GaAs of the second conductive type.

Thus, the semiconductor laser element according to the first aspect of the present invention can be produced by the process according to the second aspect of the present invention.

A layer made of GaAs of the first conductive type or the second conductive type may be formed on the second current confinement layer.

(3) According to the third aspect of the present invention, there is provided a semiconductor laser element comprising: a GaAs substrate of a first conductive type; a lower cladding layer formed above the GaAs substrate and made of $Al_{z1}Ga_{1-z1}As$ or $In_{0.49}(Al_{z2}Ga_{1-z2})_{0.51}P$ of the first conductive type, where $0.57 \leq z1 \leq 0.8$ and $0.1 \leq z2 \leq 1$; a lower optical waveguide layer formed above the lower cladding layer and made of $In_{0.49}Ga_{0.51}P$ which is undoped or the first conductive type; a compressive-strain quantum-well active layer formed above the lower optical waveguide layer and made of undoped $In_{x3}Ga_{1-x3}As_{1-y3}P_{y3}$, where $0 \leq x3 \leq 0.4$ and $0 \leq y3 \leq 0.5$; an upper optical waveguide layer formed above the compressive-strain quantum-well active layer and made of $In_{0.49}Ga_{0.51}P$ which is undoped or a second conductive type; a first etching stop layer made of $In_{x4}Ga_{1-x4}As_{1-y4}P_{y4}$ of the first conductive type or the second conductive type and formed above the upper optical waveguide layer other than stripe areas of the upper optical waveguide layer corresponding to at least one current injection region and low-refractive-index regions located on outer sides of the at least one current injection region and separated from the at least one current injection region or outermost ones of the at least one current injection region by a predetermined interval, where $0 \leq x4 \leq 1$ and $0 \leq y4 \leq 0.8$, and the stripe areas extend in an oscillation direction of a laser resonator; a first current confinement layer made of $In_{0.49}Ga_{0.51}P$ of the first conductive type and formed above the first etching stop layer; a second etching stop layer made of $In_{x4}Ga_{1-x4}As_{1-y4}P_{y4}$ of the first conductive type and formed above the first current confinement layer and ones of the stripe areas of the upper optical waveguide layer corresponding to the low-refractive-index regions, where $0 \leq x4 \leq 1$ and $0 \leq y4 \leq 0.8$; a second current confinement layer made of $In_{0.49}(Al_{z2}Ga_{1-z2})_{0.51}P$ of the first conductive type and formed above the second etching stop layer, where $0.1 \leq z2 \leq 1$; an upper cladding layer made of $In_{0.49}(Al_{z2}Ga_{1-z2})_{0.51}P$ of the second conductive type or AlGaAs which has a refractive index approximately identical to a refractive index of the second current confinement layer, and formed above the second current confinement layer and at least one of the stripe areas of the upper optical waveguide layer corresponding to the at least one current injection region; and a contact layer made of GaAs of the second conductive type and formed above the upper cladding layer.

Preferably, the semiconductor laser element according to the third aspect of the present invention may also have one or any possible combination of the following additional features (i) to (iii).

(i) The semiconductor laser element according to the third aspect of the present invention may further comprise a cap layer made of $In_{0.49}Ga_{0.51}P$ of the first conductive type or the second conductive type and formed on the second current confinement layer made of $In_{0.49}(Al_{z2}Ga_{1-z2})_{0.51}P$ of the first conductive type.

(ii) It is preferable that the width of each of the at least one current injection region is 3 micrometers or greater.

(iii) The semiconductor laser element according to the third aspect of the present invention may further comprise an InGaAsP quantum-well layer formed at a mid-thickness of the first current confinement layer, where the InGaAsP quantum-well layer has a bandgap smaller than the bandgap of the active layer.

(4) According to the fourth aspect of the present invention, there is provided a process for producing a semiconductor laser element, comprising the steps of: (a) forming above a GaAs substrate of a first conductive type a lower cladding layer made of $Al_{z1}Ga_{1-z1}As$ or $In_{0.49}(Al_{z2}Ga_{1-z2})_{0.51}P$ of the first conductive type, where $0.57 \leq z1 \leq 0.8$ and $0.1 \leq z2 \leq 1$; (b) forming above the lower cladding layer a lower optical waveguide layer made of $In_{0.49}Ga_{0.51}P$ which is undoped or the first conductive type; (c) forming above the lower optical waveguide layer a compressive-strain quantum-well active layer made of undoped $In_{x3}Ga_{1-x3}As_{1-y3}P_{y3}$, where $0 \leq x3 \leq 0.4$ and $0 \leq y3 \leq 0.5$; (d) forming above the compressive-strain quantum-well active layer an upper optical waveguide layer made of $In_{0.49}Ga_{0.51}P$ which is undoped or a second conductive type; (e) forming above the upper optical waveguide layer a first etching stop layer made of $In_{x4}Ga_{1-x4}As_{1-y4}P_{y4}$ of the first conductive type or the second conductive type, where $0 \leq x4 \leq 1$ and $0 \leq y4 \leq 0.8$; (f) forming above the first etching stop layer a first current confinement layer made of $In_{0.49}Ga_{0.51}P$ of the first conductive type; (g) removing stripe regions of the first current confinement layer and the first etching stop layer so as to expose first stripe areas of the upper optical waveguide layer, where the first stripe areas correspond to at least one current injection region and low-refractive-index regions located on outer sides of the at least one current injection region and separated from the at least one current injection region or outermost ones of the at least one current injection region by a predetermined interval, and the first stripe areas extend in an oscillation direction of a laser resonator; (h) raising temperature in a phosphorus atmosphere; (i) forming a second etching stop layer made of $In_{x4}Ga_{1-x4}As_{1-y4}P_{y4}$ of the first conductive type by regrowth above remaining areas of the first current confinement layer and the first stripe areas of the upper optical waveguide layer; (j) forming above the second etching stop layer a second current confinement layer made of $In_{0.49}(Al_{z2}Ga_{1-z2})_{0.51}P$ of the first conductive type; (k) removing stripe regions of the second current confinement layer and the second etching stop layer so as to expose at least one second stripe area of the upper optical waveguide layer, where the at least one second stripe area corresponds to the at least one current injection region, and the at least one second stripe area extends in the oscillation direction of the laser resonator; (l) raising the temperature in a phosphorus atmosphere; (m) forming an upper cladding layer of the second conductive type made of $In_{0.49}(Al_{z2}Ga_{1-z2})_{0.51}P$ or AlGaAs which has a refractive index approximately identical to a refractive index of the second current confinement layer, by regrowth above remaining areas of the second current confinement layer and the at least one second stripe area of the upper optical waveguide layer; and (n) forming above the upper cladding layer a contact layer made of GaAs of the second conductive type.

Thus, the semiconductor laser element according to the third aspect of the present invention can be produced by the process according to the fourth aspect of the present invention.

In the above descriptions of the first to fourth aspects of present invention, the first conductive type is different in the polarity of carriers from the second conductive type. That is, when the first conductive type is n type, the second conductive type is p type.

In addition, the term "undoped" means that a material is not doped with any conductive impurity.

(5) The advantages of the present invention are as follows.

(i) In the semiconductor laser elements according to the first and second aspects of the present invention, the following structure is formed in the direction perpendicular to the thickness direction and the light propagation direction in the active layer. That is, first high-refractive-index regions which have a relatively high equivalent refractive index are realized between at least one core region (corresponding to the at least one current injection region each of which has a stripe shape) and on the outer sides of the at least one core region, low-refractive-index regions which have a relatively low equivalent refractive index are realized on the outer sides of the outermost ones of the first high-refractive-index regions, and second high-refractive-index regions which have a relatively high equivalent refractive index are realized on the outer sides of the low-refractive-index regions. That is, the aforementioned ARROW structure is realized.

Since the semiconductor laser elements according to the first and second aspects of the present invention include an ARROW structure, the semiconductor laser element according to the present invention can emit a single peak beam in a transverse mode which is more effectively controlled than that in semiconductor laser elements which do not include the ARROW structure, even when the stripe width is increased.

In order to effectively control the transverse mode oscillation in the semiconductor laser elements which do not include the ARROW structure, the stripe width is required to be reduced to 3 micrometers or smaller, i.e., the width of the active region is required to be reduced. Therefore, when the output power is increased, the optical density in the active layer increases, and thus facet degradation is likely to occur. Consequently, the semiconductor laser elements which do not include the ARROW structure cannot operate with high output power in an effectively controlled transverse mode.

On the other hand, since the semiconductor laser elements according to the first and second aspects of the present invention include the ARROW structure, light can be satisfactorily confined in a wide stripe (active) region, and therefore the semiconductor laser element according to the present invention can emit laser light in the fundamental transverse mode from the wide active region.

(ii) In particular, when the width of the active region is increased to 3 micrometers or greater, the optical density in the active layer can be reduced, and therefore the temperature rise due to non-radiative recombination in vicinities of end facets can be decreased. Thus, the semiconductor laser elements according to the first and second aspects of the present invention can emit a laser beam in the fundamental transverse mode with higher power than the semiconductor laser elements which do not include the ARROW structure.

(iii) In the semiconductor laser element according to the first aspect of the present invention, the optical waveguide layers and the first current confinement layer are made of GaAs. Therefore, refractive indexes of the high-refractive-index regions can be easily controlled. That is, it is possible to obtain an ARROW structure in which the distribution of the refractive index in the horizontal directions can be easily controlled.

(iv) When an InGaAs quantum-well layer is formed at a mid-thickness of the first current confinement layer in the semiconductor laser element according to the first aspect of the present invention, and the InGaAs quantum-well layer has a bandgap smaller than the bandgap of the active layer, the gain in the oscillation in the fundamental transverse mode can be increased since the InGaAs quantum-well layer absorbs light.

(v) When the process according to the second aspect of the present invention is used, it is possible to easily produce a semiconductor laser element having an ARROW structure with high precision.

(vi) In the semiconductor laser element according to the first aspect of the present invention, almost only the AlGaAs current confinement layer and the GaAs upper optical waveguide layer are exposed at the surface as a base of the regrowth. That is, As and P do not coexist on the surface which is exposed at the time of an operation of regrowth. Therefore, P-As interdiffusion does not occur, and thus the quality of the regrown crystal can be improved.

(vii) In the semiconductor laser element according to the first aspect of the present invention, the etching stop layers are made of InGaP. Therefore, the accuracy of the etching of the GaAs layers is increased, and it is possible to precisely realize a distribution of the equivalent refractive index which is necessary for an ARROW structure.

(viii) When a cap layer made of GaAs of the first conductive type or the second conductive type is formed on the second current confinement layer (made of $Al_{z1}Ga_{1-z1}As$ of the first conductive type) in the semiconductor laser element according to the first aspect of the present invention, only small portions of the AlGaAs second current confinement layer are exposed at the time of the regrowth of the upper cladding layer, and therefore aluminum oxidation can be reduced. Thus, it is possible to improve the crystal quality and the reliability.

(ix) Since the semiconductor laser element according to the second aspect of the present invention includes the optical waveguide layers made of $In_{0.49}Ga_{0.51}P$ and the first current confinement layer made of $In_{0.49}Ga_{0.51}P$ of the first conductive type, the distribution of the equivalent refractive index for the ARROW structure can be easily realized by controlling the thickness of the $In_{0.49}Ga_{0.51}P$ upper optical waveguide layer. In addition, the refractive index of $In_{0.49}Ga_{0.51}P$, of which the first current confinement layer is made, is higher than that of InGaAlP, and the first current confinement layer can also behave as an additional portion of the upper optical waveguide layer. Therefore, the equivalent refractive index of the high-refractive-index regions can be easily controlled, and the light can be efficiently confined. Thus, it is possible to obtain high-quality laser light.

(x) In the semiconductor laser element according to the second aspect of the present invention, almost only the InGaP first current confinement layer is exposed at the surface as a base of the regrowth of the second etching stop layer. Since As and P do not coexist on the surface, P-As interdiffusion does not occur. Therefore, it is possible to improve the quality of the regrown crystal, and obtain a reliable semiconductor laser element.

(xi) In the semiconductor laser element according to the second aspect of the present invention, the first and second etching stop layers are made of InGaAsP, and the layer adjacent to the first and second etching stop layers is made of InGaP. Therefore, it is possible to increase the accuracy of the etching, and precisely realize the distribution of the equivalent refractive index which is necessary for the ARROW structure.

(xii) When a cap layer made of $In_{0.49}Ga_{0.51}P$ of the first conductive type or the second conductive type is formed on the second current confinement layer (made of $In_{0.49}(Al_{z2}Ga_{1-z2})_{0.51}P$ of the first conductive type) in the semiconductor laser element according to the second aspect of the present invention, only small portions of the $In_{0.49}(Al_{z2}Ga_{1-z2})_{0.51}P$ second current confinement layer are exposed at the time of the regrowth of the upper cladding layer. Therefore, degradation caused by aluminum oxidation can be prevented. Thus, it is possible to improve the crystal quality and the reliability.

(xiii) When an InGaAsP quantum-well layer is formed at a mid-thickness of the first current confinement layer in the semiconductor laser element according to the second aspect of the present invention, and the InGaAsP quantum-well layer has a bandgap smaller than the bandgap of the active layer, the gain in the oscillation in the fundamental transverse mode can be increased since the InGaAsP quantum-well layer absorbs light.

(xiv) When the process according to the second aspect of the present invention is used, it is possible to easily produce a semiconductor laser element having an ARROW structure with high precision. In addition, since the temperature is raised in a phosphorus atmosphere, the regrowth becomes easy, and the crystal quality of the regrown layers such as the InGaAlP layer can be improved.

DESCRIPTION OF THE DRAWINGS

FIGS. 11A to 11D are cross-sectional views illustrating representative stages in a process for producing a semiconductor laser element as the first embodiment.

DESCRIPTION OF PREFERRED EMBODIMENTS

Embodiments of the present invention are explained in detail below with reference to drawings.

First Embodiment

Figure 1:
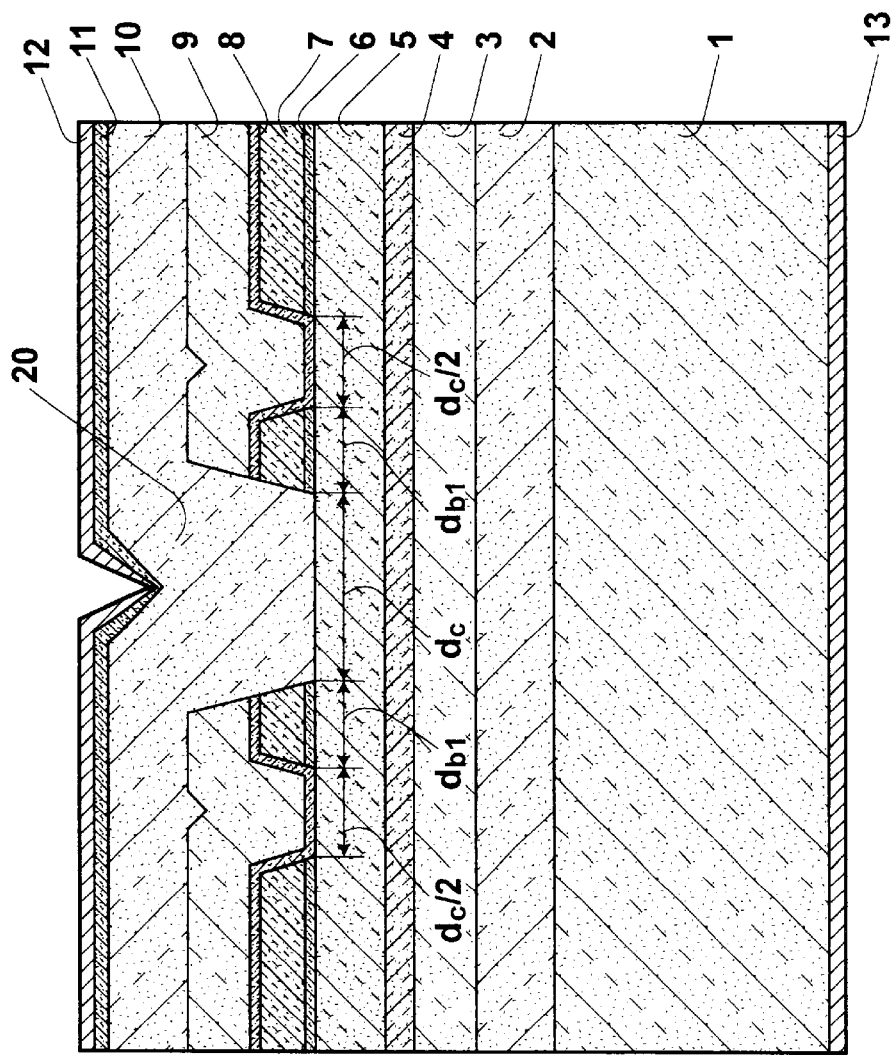
FIG. 1 is a cross-sectional view of a semiconductor laser element as a first embodiment of the present invention.

The semiconductor laser element as the first embodiment of the present invention is explained below. FIG. 1 is a cross-sectional view of the semiconductor laser element as the first embodiment.

As illustrated in FIG. 1, the semiconductor laser element as the first embodiment comprises a stack of an n-type $Al_{z1}Ga_{1-z1}As$ lower cladding layer 2 ($0.2 \leq z1 \leq 0.8$), an n-type or i-type (intrinsic) GaAs lower optical waveguide layer 3, an $In_{x3}Ga_{1-x3}As_{1-y3}P_{y3}$ quantum-well active layer 4 ($0.49y3 < x3 \leq 0.4$, $0 \leq y3 \leq 0.1$), and a p-type or i-type GaAs upper optical waveguide layer 5 which are formed on an n-type GaAs substrate 1. In addition, a p-type $In_{x8}Ga_{1-x8}P$ first etching stop layer 6 ($0 \leq x8 \leq 1$), an n-type GaAs first current confinement layer 7, a p-type $In_{x9}Ga_{1-x9}P$ second etching stop layer 8 ($0 \leq x9 \leq 1$), an n-type $Al_{z1}Ga_{1-z1}As$ second current confinement layer 9, a p-type $Al_{z1}Ga_{1-z1}As$ upper cladding layer 10, and a p-type GaAs contact layer 11 are formed on the above stack in the manner described below.

The p-type $In_{x8}Ga_{1-x8}P$ first etching stop layer 6 and the n-type GaAs first current confinement layer 7 have stripe openings so as to expose stripe areas of the p-type or i-type GaAs upper optical waveguide layer 5. The stripe openings extend in the direction of a resonator, and are located at positions corresponding to a current injection region 20 and low-refractive-index regions. The low-refractive-index regions are located on the outer sides of the current injection region 20, and the stripe openings corresponding to the low-refractive-index regions are separated from the stripe opening corresponding to the current injection region 20 by a distance $d_{b1}$. The stripe opening corresponding to the current injection region 20 has a width of $d_c$, and the stripe openings corresponding to the low-refractive-index regions each have a width $d_c/2$.

The p-type $In_{x9}Ga_{1-x9}P$ second etching stop layer 8 is formed over the n-type GaAs first current confinement layer 7 and the stripe areas of the p-type or i-type GaAs upper optical waveguide layer 5 corresponding to the low-refractive-index regions. In addition, the n-type $Al_{z1}Ga_{1-z1}As$ second current confinement layer 9 is formed on the p-type $In_{x9}Ga_{1-x9}P$ second etching stop layer 8. That is, each of the p-type $In_{x9}Ga_{1-x9}P$ second etching stop layer 8 and the n-type $Al_{z1}Ga_{1-z1}As$ second current confinement layer 9 has a stripe opening corresponding to the current injection region 20, so that the stripe area of the p-type or i-type GaAs upper optical waveguide layer 5 corresponding to the current injection region 20 is exposed. The p-type $Al_{z1}Ga_{1-z1}As$ upper cladding layer 10 is formed over the n-type $Al_{z1}Ga_{1-z1}As$ second current confinement layer 9 and the exposed stripe area of the p-type or i-type GaAs upper optical waveguide layer 5, and the p-type GaAs contact layer 11 is formed on the p-type $Al_{z1}Ga_{1-z1}As$ upper cladding layer 10.

Alternatively, the lower cladding layer 2 may be made of n-type $In_{0.49}Ga_{0.51}P$ which lattice-matches with GaAs, instead of n-type $Al_{z1}Ga_{1-z1}As$.

In either case, it is possible to obtain a distribution of the equivalent refractive index which is required for formation of an ARROW structure.

Figure 2:
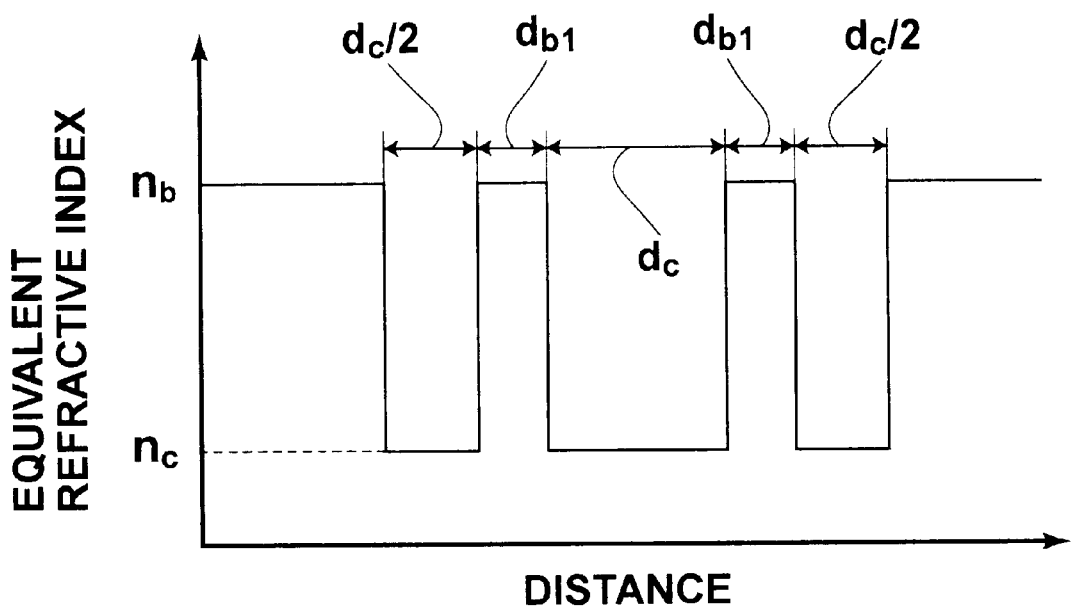
FIG. 2 is a diagram illustrating a distribution of the equivalent refractive index of an active layer in a direction perpendicular to the thickness direction and the light propagation direction in the case where the semiconductor laser element includes a single-core ARROW structure.

FIG. 2 shows a distribution of the equivalent refractive index of the active layer of the semiconductor laser element of FIG. 1 in the direction perpendicular to the thickness direction and the light propagation direction. As illustrated in FIG. 2, the core region being located at the center and corresponding to the current injection region 20 has a width $d_c$ and a low equivalent refractive index $n_c$, a first pair of stripe regions (first high-refractive-index regions) being located immediately adjacent to the core region on both sides and each having a width $d_{b1}$ have a high equivalent refractive index $n_b$, a second pair of stripe regions (low-refractive-index regions) being located on the outer sides of the first pair of stripe regions and each having a width $d_c/2$ have the low equivalent refractive index $n_c$, and the other regions (second high-refractive-index regions) located on the outer sides of the second pair of stripe regions have the high equivalent refractive index $n_b$.

It is preferable that the above width $d_{b1}$ of each of the first high-refractive-index regions arranged on the outer sides of the core region is determined by the following equation (3), where $\lambda$ is the oscillation wavelength, and m is a positive integer.

$$d_{b1} = \frac{(2m+1)\lambda}{4\left\{n_b^2 - n_c^2 + \left(\frac{\lambda}{2d_c}\right)^2\right\}^{\frac{1}{2}}} \quad (3)$$

In particular, the provision of the above second pair of stripe regions (low-refractive-index regions each having a width $d_c/2$) enables prevention of leakage of light in the lateral direction perpendicular to the thickness direction and the light propagation direction (i.e., in the direction of the above distribution of the equivalent refractive index), emission of a single-peak, diffraction-limited beam, and realization of a satisfactory ARROW structure.

Second Embodiment

Figure 3:
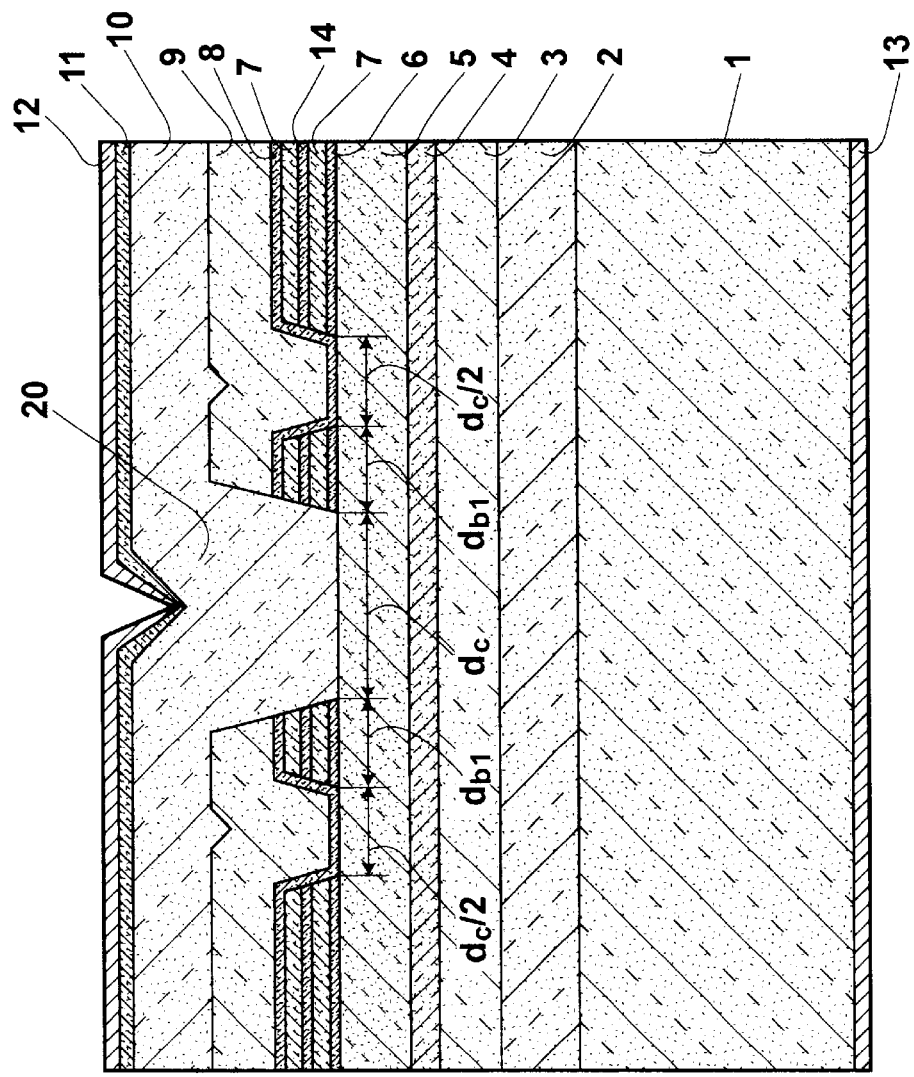
FIG. 3 is a cross-sectional view of a semiconductor laser element as a second embodiment of the present invention.

The semiconductor laser element as the second embodiment of the present invention is explained below. FIG. 3 is a cross-sectional view of the semiconductor laser element as the second embodiment. The elements in FIG. 3 which bear the same reference numerals as FIG. 1 have the same functions as the corresponding elements in FIG. 1. Therefore, the explanations on those elements are not repeated here.

As illustrated in FIG. 3, the semiconductor laser element as the second embodiment is different from the semiconductor laser element as the first embodiment in that an InGaAs quantum-well layer 14 is formed at a mid-thickness of the n-type GaAs first current confinement layer 7, where the InGaAs quantum-well layer 14 has a bandgap smaller than the i-type $In_{x3}Ga_{1-x3}As_{1-y3}P_{y3}$ quantum-well active layer 4. Since the InGaAs quantum-well layer 14 absorbs light, the gain in the fundamental transverse mode can be increased when the semiconductor laser element comprises the InGaAs quantum-well layer 14.

Figure 4:
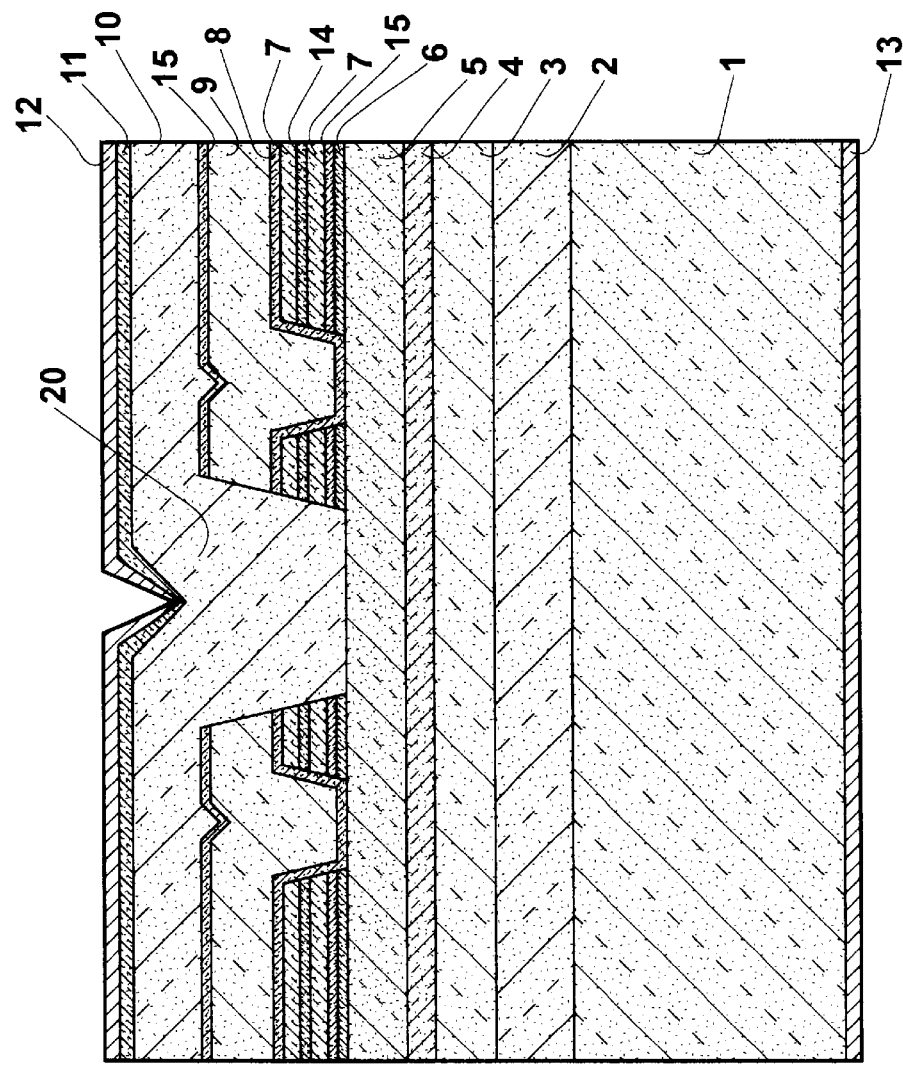
FIG. 4 is a cross-sectional view of a variation of the semiconductor laser element as the second embodiment of the present invention in which a GaAs layer 15 and a GaAs cap layer 16 are provided.

In addition, it is possible to form an n-type or p-type GaAs cap layer 15 on the n-type $Al_{z1}Ga_{1-z1}As$ second current confinement layer 9, as illustrated in FIG. 4. In this case, it is possible to reduce the area of the n-type $Al_{z1}Ga_{1-z1}As$ second current confinement layer 9 which is exposed before formation of the p-type $Al_{z1}Ga_{1-z1}As$ upper cladding layer 10. Therefore, the lowering of the reliability due to oxidation of aluminum can be prevented.

Further, when the thickness of the p-type or i-type GaAs upper optical waveguide layer 5 is 100 nm or smaller, it is possible to form a p-type GaAs layer 16 between the n-type GaAs first current confinement layer 7 and the p-type $In_{x8}Ga_{1-x8}P$ first etching stop layer 6. Since, in this case, current leakage from the n-type GaAs first current confinement layer 7 can be prevented, the electric characteristics of the semiconductor laser element can be improved.

Furthermore, in order to suppress non-radiative recombination currents produced by light absorption in vicinities of the end facets, it is possible to remove near-edge portions of the p-type GaAs contact layer 11. In this case, the output power of the semiconductor laser element can be increased.

Moreover, It is possible to form tensile-strain barrier layers made of i-type $In_{x4}Ga_{1-x4}As_{1-y4}P_{y4}$ so that the active layer is sandwiched between the tensile-strain barrier layers, and the compressive strain in the active layer is compensated for, where $0 \leq x4 < 0.49y4$ and $0 < y4 \leq 0.4$. In this case, it is possible to reduce the total strain in the vicinities of the active layer, and improve the crystallinity of the active layer.

Third Embodiment

Although the semiconductor laser devices as the first and second embodiments of the present invention has a single-core ARROW structure, it is possible to form a multicore ARROW structure having a plurality of core regions. In this case, for example, a distribution of the equivalent refractive index of an active layer in the direction perpendicular to thickness and propagation of light is realized as illustrated in FIG. 5.

Figure 5:
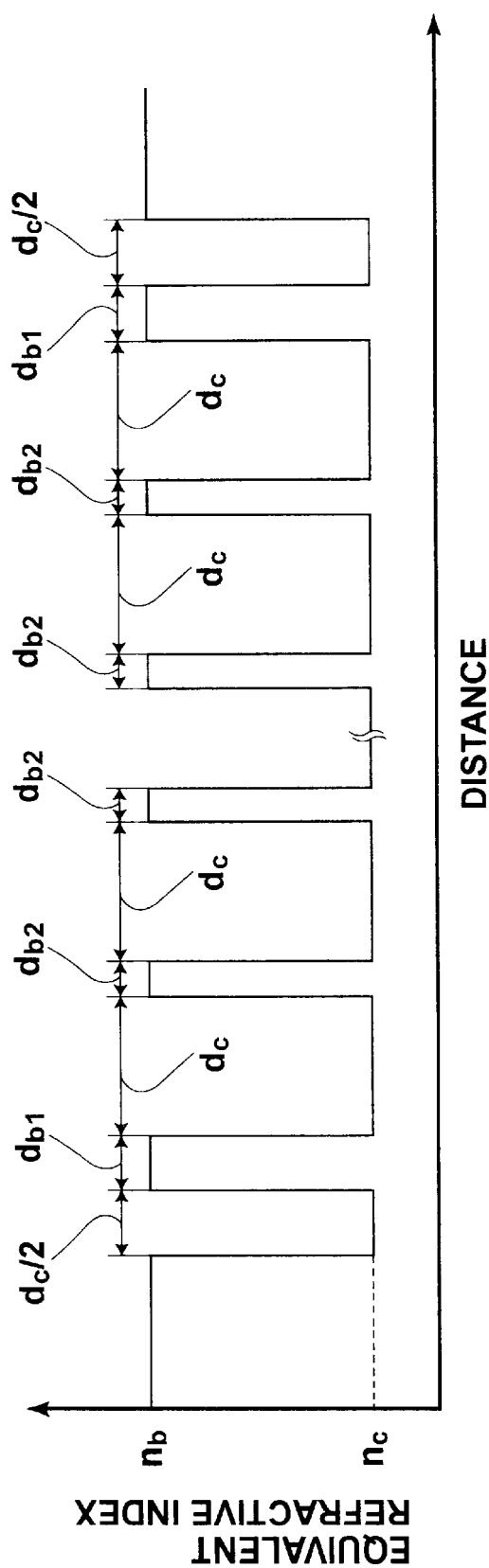
FIG. 5 is a diagram illustrating a distribution of the equivalent refractive index of an active layer in a direction perpendicular to the thickness direction and the light propagation direction in the case where the semiconductor laser element includes a multicore ARROW structure.

FIG. 5 shows a distribution of the equivalent refractive index of the active layer in the direction perpendicular to thickness and propagation of light in a semiconductor laser device having a multicore ARROW structure. In the distribution illustrated in FIG. 5, the plurality of core regions have a low equivalent refractive index $n_c$, outermost ones of a plurality of high-refractive-index stripe regions having a high equivalent refractive index $n_b$ each have a width $d_{b1}$, and the other high-refractive-index stripe regions having the high equivalent refractive index $n_b$ each have a width $d_{b2}$. It is preferable that the width $d_{b1}$ is determined by the aforementioned equation (3), and the width $d_{b2}$ is determined by the following equation (4), where m is a positive integer.

$$d_{b2} = \frac{m\lambda}{2\left\{n_b^2 - n_c^2 + \left(\frac{\lambda}{2d_c}\right)^2\right\}^{\frac{1}{2}}} \quad (4)$$

Figure 6:
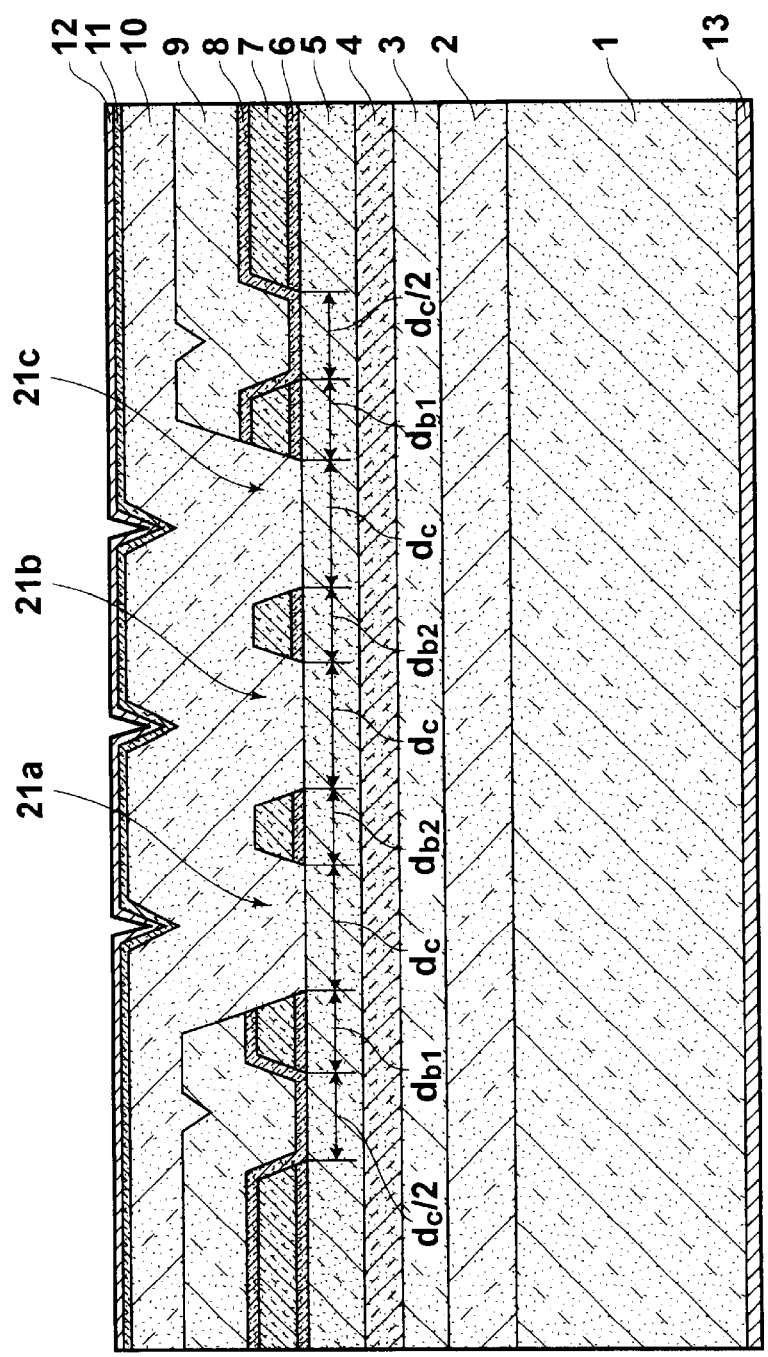
FIG. 6 is a cross-sectional view of a semiconductor laser element as a third embodiment of the present invention.

The semiconductor laser element as the third embodiment of the present invention is explained below. FIG. 6 is a cross-sectional view of the semiconductor laser element as the third embodiment. The elements in FIG. 6 which bear the same reference numerals as FIG. 1 have the same functions as the corresponding elements in FIG. 1. Therefore, the explanations on those elements are not repeated here.

As illustrated in FIG. 6, the semiconductor laser element as the third embodiment has a multicore structure including three cores. The semiconductor laser element of FIG. 6 comprises substantially the same semiconductor layers as the construction of FIG. 1 except that the p-type $In_{x8}Ga_{1-x8}P$ first etching stop layer 6 and the n-type GaAs first current confinement layer 7 have three stripe openings corresponding to the three current injection regions 21a, 21b, and 21c and two side stripe openings located on the outer sides of the outermost ones of the three stripe openings corresponding to the current injection regions 21a and 21c. The three stripe openings are spaced with intervals $d_{b2}$, and each have a width $d_c$. The two side stripe openings each have a width $d_c/2$, and are separated from the outermost ones 21a and 21c of the current injection regions by a distance $d_{b1}$. Thus, the multicore structure including three cores is realized.

Since the multicore ARROW structure includes more than one core region, the output power of the semiconductor laser device can be increased.

Fourth Embodiment

Figure 7:
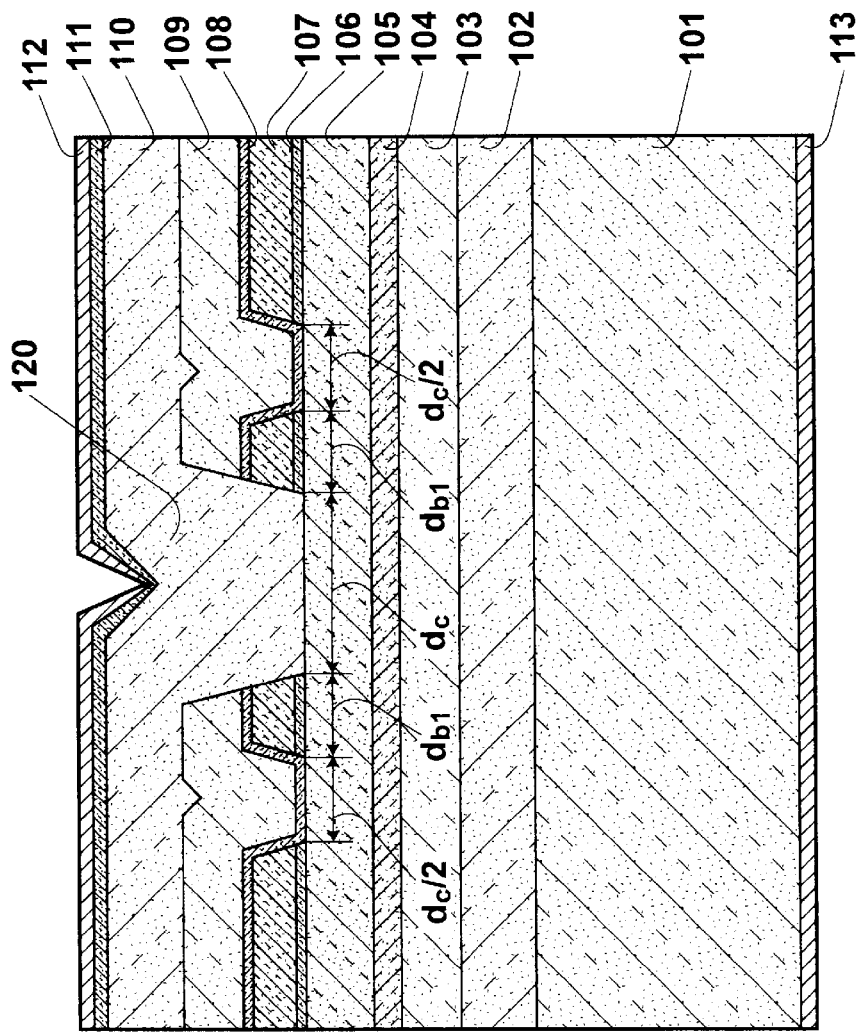
FIG. 7 is a cross-sectional view of a semiconductor laser element as a fourth embodiment of the present invention.

The semiconductor laser element as the fourth embodiment of the present invention is explained below. FIG. 7 is a cross-sectional view of the semiconductor laser element as the fourth embodiment.

As illustrated in FIG. 7, the semiconductor laser element as the fourth embodiment comprises a stack of an n-type $Al_{z1}Ga_{1-z1}As$ lower cladding layer 102 ($0.57 \leq z1 \leq 0.8$), an n-type or i-type (intrinsic) $In_{0.49}Ga_{0.51}P$ lower optical waveguide layer 103, an i-type $In_{x3}Ga_{1-x3}As_{1-y3}P_{y3}$ quantum-well active layer 104 ($0 \leq x3 \leq 0.4$, $0 \leq y3 \leq 0.5$), and a p-type or i-type $In_{0.49}Ga_{0.51}P$ upper optical waveguide layer 105 which are formed on an n-type GaAs substrate 101. In addition, a p-type $In_{x4}Ga_{1-x4}As_{1-y4}P_{y4}$ first etching stop layer 106 ($0 \leq x4 \leq 1$, $0 \leq y4 \leq 0.8$), an n-type $In_{0.49}Ga_{0.51}P$ first current confinement layer 107, an n-type $In_{x4}Ga_{1-x4}As_{1-y4}P_{y4}$ second etching stop layer 108 ($0 \leq x4 \leq 1$, $0 \leq y4 \leq 0.8$), an n-type $In_{0.49}(Al_{z2}Ga_{1-z2})_{0.51}P$ second current confinement layer 109 ($0.1 \leq z2 \leq 1$), a p-type $In_{0.49}(Al_{z2}Ga_{1-z2})_{0.51}P$ upper cladding layer 110, and a p-type GaAs contact layer 111 are formed on the above stack in the manner described below.

The p-type $In_{x4}Ga_{1-x4}As_{1-y4}P_{y4}$ first etching stop layer 106 and the n-type $In_{0.49}Ga_{0.51}P$ first current confinement layer 107 have stripe openings so as to expose stripe areas of the p-type or i-type $In_{0.49}Ga_{0.51}P$ upper optical waveguide layer 105. The stripe openings extend in the direction of a resonator, and are located at positions corresponding to a current injection region 120 and low-refractive-index regions. The low-refractive-index regions are located on the outer sides of the current injection region 120, and the stripe openings corresponding to the low-refractive-index regions are separated from the stripe opening corresponding to the current injection region 120 by a distance $d_{b1}$. The stripe opening corresponding to the current injection region 120 has a width of $d_c$, and the stripe openings corresponding to the low-refractive-index regions each have a width $d_c/2$.

The n-type $In_{x4}Ga_{1-x4}As_{1-y4}P_{y4}$ second etching stop layer 108 is formed over the n-type $In_{0.49}Ga_{0.51}P$ first current confinement layer 107 and the stripe areas of the p-type or i-type $In_{0.49}Ga_{0.51}P$ upper optical waveguide layer 105 corresponding to the low-refractive-index regions. In addition, the n-type $In_{0.49}(Al_{z2}Ga_{1-z2})_{0.51}P$ second current confinement layer 109 is formed on the n-type $In_{x4}Ga_{1-x4}As_{1-y4}P_{y4}$ second etching stop layer 108. That is, each of the n-type $In_{x4}Ga_{1-x4}As_{1-y4}P_{y4}$ second etching stop layer 108 and the n-type $In_{0.49}(Al_{z2}Ga_{1-z2})_{0.51}P$ second current confinement layer 109 has a stripe opening corresponding to the current injection region 120, so that the stripe area of the p-type or i-type $In_{0.49}Ga_{0.51}P$ upper optical waveguide layer 105 corresponding to the current injection region 120 is exposed. The p-type $In_{0.49}(Al_{z2}Ga_{1-z2})_{0.51}P$ upper cladding layer 110 is formed over the n-type $In_{0.49}(Al_{z2}Ga_{1-z2})_{0.51}P$ second current confinement layer 109 and the exposed stripe area of the p-type or i-type $In_{0.49}Ga_{0.51}P$ upper optical waveguide layer 105, and the p-type GaAs contact layer 11 is formed on the p-type $In_{0.49}(Al_{z2}Ga_{1-z2})_{0.51}P$ upper cladding layer 110.

Alternatively, the lower cladding layer 102 may be made of n-type $In_{0.49}(Al_{z2}Ga_{1-z2})_{0.51}P$ ($0.1 \leq z2 \leq 1$) which lattice-matches with GaAs, instead of n-type $Al_{z1}Ga_{1-z1}As$.

In either case, it is possible to obtain a distribution of the equivalent refractive index which is required for formation of an ARROW structure.

In addition, the upper cladding layer 110 may be made of AlGaAs which has approximately the same refractive index as the n-type $In_{0.49}(Al_{z2}Ga_{1-z2})_{0.51}P$ second current confinement layer 109.

Further, the first etching stop layer 106 may be n-type.

The semiconductor laser element of FIG. 7 also has a distribution of the equivalent refractive index of the active layer in the direction perpendicular to the thickness direction and the light propagation direction as illustrated in FIG. 2. In addition, it is also preferable that the width $d_{b1}$ of each of the high-refractive-index regions arranged on the outer sides of the core region is determined by the aforementioned equation (3).

Similar to the first embodiment, the provision of the aforementioned pair of stripe regions (low-refractive-index regions each having a width $d_c/2$) enables prevention of leakage of light in the lateral direction perpendicular to the thickness direction and the light propagation direction (i.e., in the direction of the above distribution of the equivalent refractive index), emission of an unimodal, diffraction-limited beam, and realization of a satisfactory ARROW structure.

Fifth Embodiment

Figure 8:
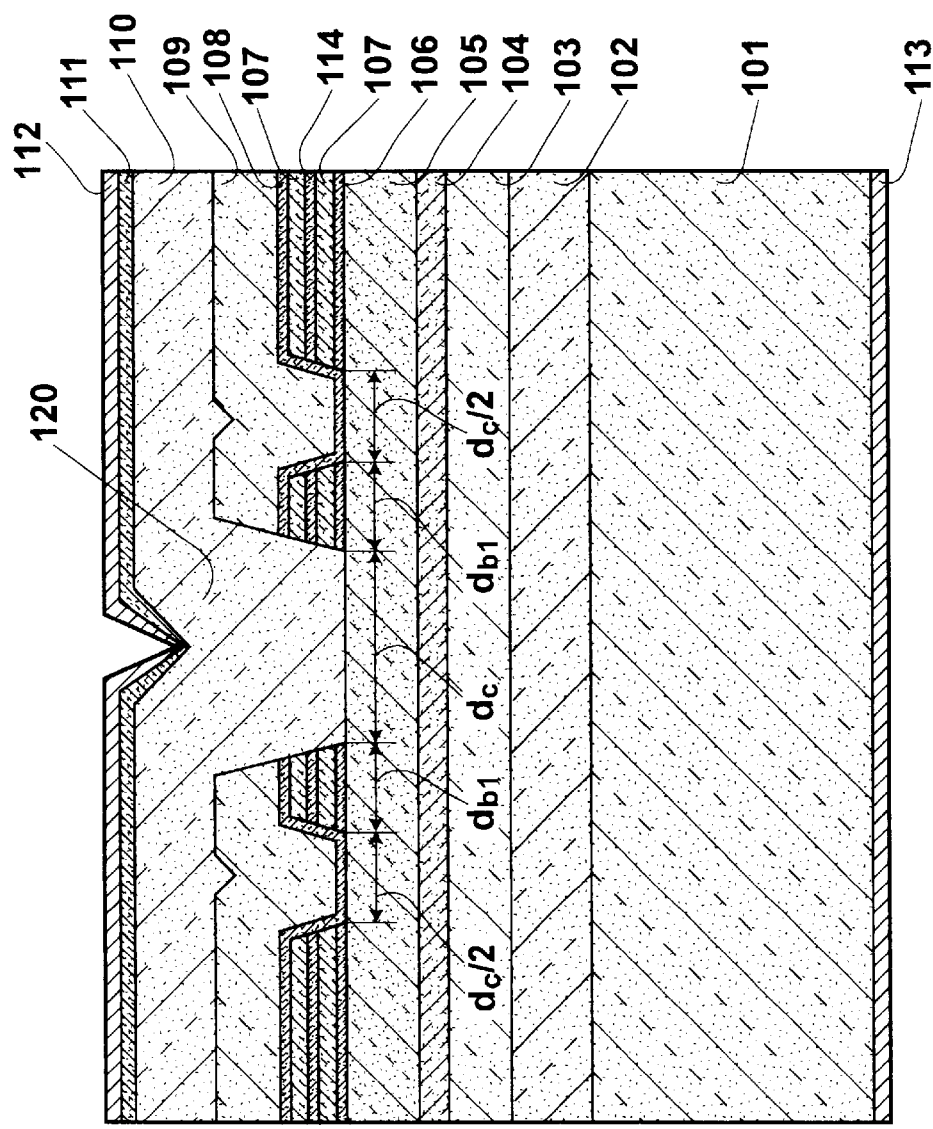
FIG. 8 is a cross-sectional view of a semiconductor laser element as a fifth embodiment of the present invention.

The semiconductor laser element as the fifth embodiment of the present invention is explained below. FIG. 8 is a cross-sectional view of the semiconductor laser element as the fifth embodiment. The elements in FIG. 8 which bear the same reference numerals as FIG. 7 have the same functions as the corresponding elements in FIG. 7. Therefore, the explanations on those elements are not repeated here.

As illustrated in FIG. 8, the semiconductor laser element as the fifth embodiment is different from the semiconductor laser element as the fourth embodiment in that an InGaAsP quantum-well layer 114 is formed at a mid-thickness of the n-type $In_{0.49}Ga_{0.51}P$ first current confinement layer 107, where the InGaAsP quantum-well layer 114 has a bandgap smaller than the i-type $In_{x3}Ga_{1-x3}As_{1-y3}P_{y3}$ quantum-well active layer 104. Since the InGaAsP quantum-well layer 114 absorbs light, the gain in the fundamental transverse mode can be increased when the semiconductor laser element comprises the InGaAsP quantum-well layer 114.

Further, in order to suppress non-radiative recombination currents produced by light absorption in vicinities of the end facets, it is possible to remove near-edge portions of the p-type GaAs contact layer 111. In this case, the output power of the semiconductor laser element can be increased.

Figure 9:
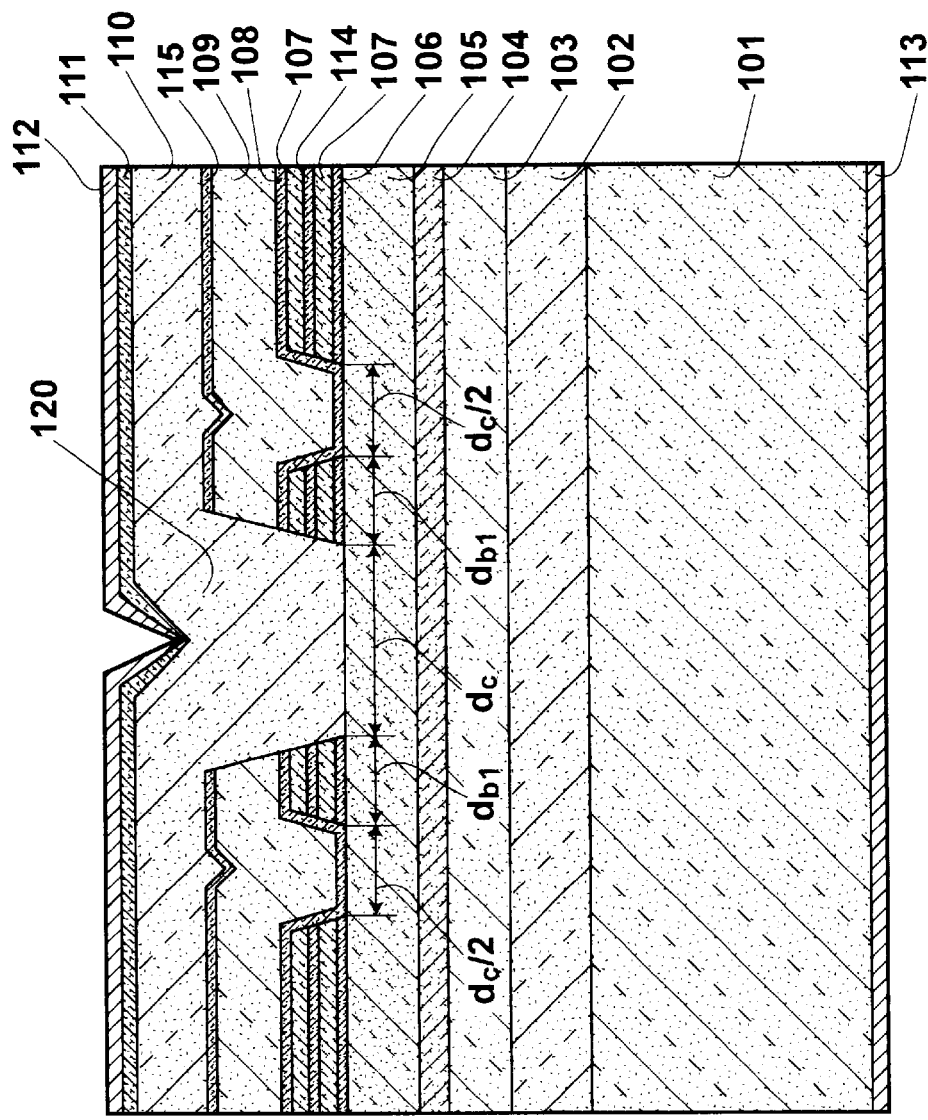
FIG. 9 is a cross-sectional view of a variation of the semiconductor laser element as the sixth embodiment of the present invention in which an $In_{0.49}Ga_{0.51}P$ cap layer 115 is provided.

Furthermore, it is possible to form an $In_{0.49}Ga_{0.51}P$ cap layer 115 having a thickness of 20 nm or smaller on the n-type $In_{0.49}(Al_{z2}Ga_{1-z2})_{0.51}P$ second current confinement layer 109, as illustrated in FIG. 9. Alternatively, the cap layer 115 may be made of GaAs. Further, it is possible to form the $In_{0.49}Ga_{0.51}P$ cap layer 115 (having a thickness of 20 nm or smaller) and a GaAs cap layer (having a thickness of 20 nm or smaller) in this order on the n-type $In_{0.49}(Al_{z2}Ga_{1-z2})_{0.51}P$ second current confinement layer 109. When the above cap layer or layers are formed on the n-type $In_{0.49}(Al_{z2}Ga_{1-z2})_{0.51}P$ second current confinement layer 109, it is possible to reduce the area of the aluminum-containing layer which is exposed at the surface as a base of regrowth of the p-type $In_{0.49}(Al_{z2}Ga_{1-z2})_{0.51}P$ upper cladding layer 110. Therefore, the regrowth becomes easy, and crystal quality can be improved. In addition, since the above GaAs cap layer is removed during the process for removing the n-type $In_{x4}Ga_{1-x4}As_{1-y4}P_{y4}$ second etching stop layer 108, the formation of the GaAs cap layer is effective for removal of adherents in the photolithographic process. Thus, when the above cap layer or layers are formed, it is possible to suppress defects caused by the adherents.

Sixth Embodiment

Although the semiconductor laser devices as the fourth and fifth embodiments of the present invention has a single-core ARROW structure, it is possible to form a multicore ARROW structure including a plurality of core regions by using the semiconductor layers having the same compositions as the fourth and fifth embodiments. In this case, for example, a distribution of the equivalent refractive index of an active layer in the direction perpendicular to thickness and propagation of light is realized as illustrated in FIG. 5. In addition, it is also preferable that the width $d_{b2}$ of each of the high-refractive-index regions arranged between the core regions is determined by the aforementioned equation (4).

Figure 10:
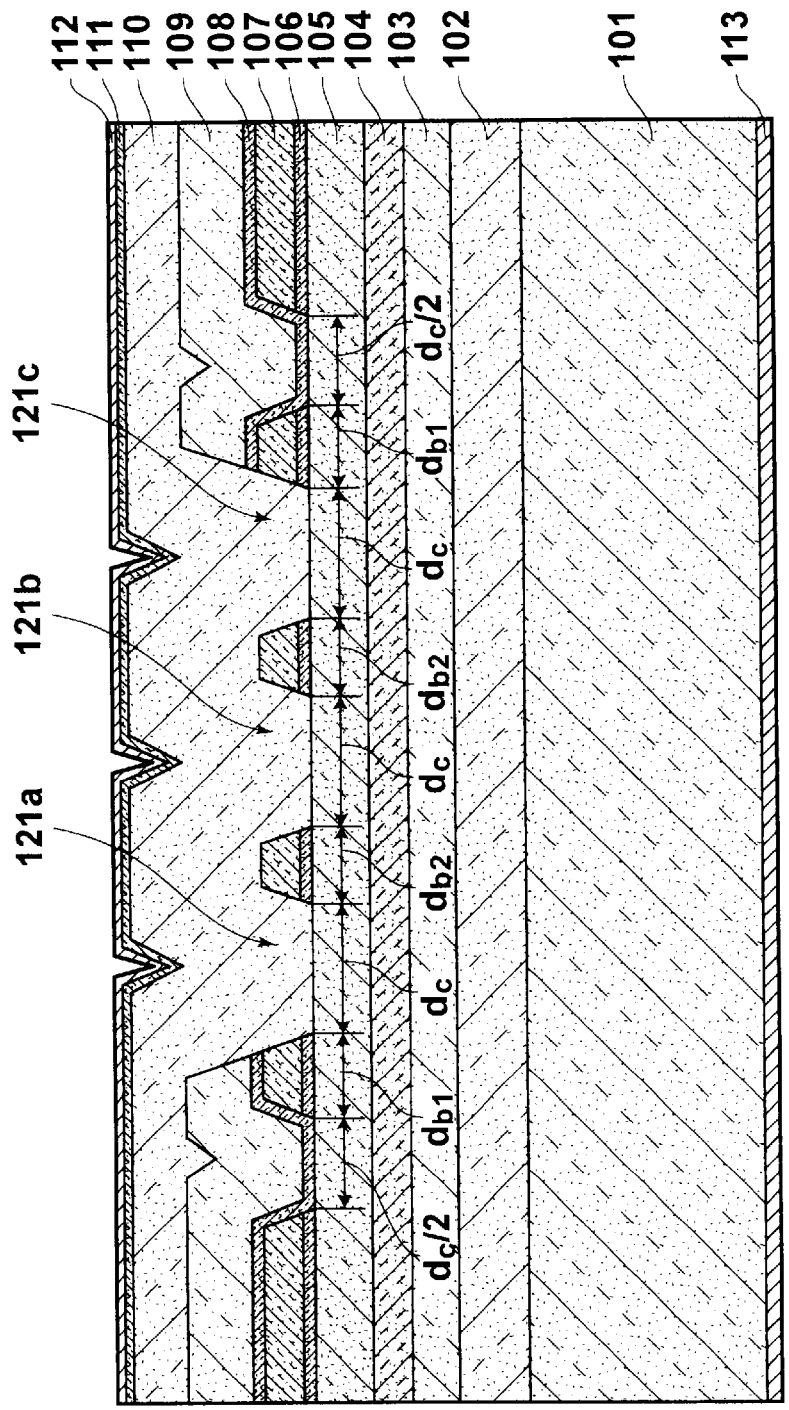
FIG. 10 is a cross-sectional view of a semiconductor laser element as a sixth embodiment of the present invention.

The semiconductor laser element as the sixth embodiment of the present invention is explained below. FIG. 10 is a cross-sectional view of the semiconductor laser element as the sixth embodiment. The elements in FIG. 10 which bear the same reference numerals as FIG. 7 have the same functions as the corresponding elements in FIG. 7. Therefore, the explanations on those elements are not repeated here.

As illustrated in FIG. 10, the semiconductor laser element as the sixth embodiment has a multicore structure including three cores. Although the semiconductor laser element of FIG. 10 comprises substantially the same semiconductor layers as the construction of FIG. 7 except that the p-type $In_{x4}Ga_{1-x4}As_{1-y4}P_{y4}$ first etching stop layer 106 and the n-type $In_{0.49}Ga_{0.51}P$ first current confinement layer 107 have three stripe openings corresponding to the three current injection regions 121a, 121b, and 121c and two side stripe openings located on the outer sides of the outermost ones of the three stripe openings corresponding to the current injection regions 121a and 121c. The three stripe openings are spaced with intervals $d_{b2}$, and each have a width $d_c$. The two side stripe openings each have a width $d_c/2$, and are separated from the outermost ones 121a and 121c of the current injection regions by a distance $d_{b1}$. Thus, the multicore structure including three cores is realized.

Since the multicore ARROW structure includes more than one core region, the output power of the semiconductor laser device can be increased.

CONCRETE EXAMPLE I

Hereinbelow, a concrete construction of the layers of the semiconductor laser element as the first embodiment and an example of a process for producing the concrete construction are explained below with reference to FIGS. 11A to 11D.

In organometallic vapor phase epitaxy used in the process explained below, trimethyl gallium (TMG), trimethyl indium (TMI), trimethyl aluminum (TMA), arsine, and phosphine are used as raw materials, silane gas is used as n-type dopant gas, and dimethyl zinc (DMZ) is used as p-type dopant gas.

As illustrated in FIG. 11A, an n-type $Al_{z1}Ga_{1-z1}As$ lower cladding layer 2, an n-type or i-type GaAs lower optical waveguide layer 3, an i-type $In_{x3}Ga_{1-x3}As_{1-y3}P_{y3}$ quantum-well active layer 4 ($0.49y3<x3\leq0.4$, $0\leq y3\leq0.1$) having a thickness of about 5 to 20 nm, a p-type or i-type GaAs upper optical waveguide layer 5, a p-type $In_{x8}Ga_{1-x8}P$ first etching stop layer 6, and an n-type GaAs first current confinement layer 7 having a thickness of 0.5 micrometers are formed on a (001) face of an n-type GaAs substrate 1 by organometallic vapor phase epitaxy. When x3=0.2 and y3=0, the oscillation wavelength is 980 nm. When the composition of the active layer is varied, the oscillation wavelength can be controlled within a range of 900 to 1,200 nm.

Next, as illustrated in FIG. 11B, a resist pattern which includes a center stripe opening and two side stripe openings is formed on the n-type GaAs first current confinement layer 7 by photolithography. The center stripe opening corresponds to a current injection region 20, and has a width of 6 micrometers. The side stripe openings each have a width of 3 micrometers, and are located on both sides of the center stripe opening and separated from the center stripe opening by 1.8 micrometers. The n-type GaAs first current confinement layer 7 is etched with a solution of sulfuric acid and hydrogen peroxide as an etchant by using the above resist pattern as a mask. At this time, the etching automatically stops at the upper boundary of the p-type $In_{x8}Ga_{1-x8}P$ first etching stop layer 6, and stripe areas of the p-type $In_{x8}Ga_{1-x8}P$ first etching stop layer 6 corresponding to the above center and side stripe openings are exposed. Then, the above resist is removed, and the exposed stripe areas of the p-type $In_{x8}Ga_{1-x8}P$ first etching stop layer 6 are etched with a hydrochloric acid etchant. At this time, the etching automatically stops at the upper boundary of the p-type or i-type GaAs upper optical waveguide layer 5. Therefore, stripe areas of the p-type or i-type GaAs upper optical waveguide layer 5 corresponding to the above center and side stripe openings are exposed. Subsequently, the temperature is raised in an arsenic atmosphere, and thereafter a p-type $In_{x9}Ga_{1-x9}P$ second etching stop layer 8 ($0\leq x9\leq 1$) and an n-type $Al_{z1}Ga_{1-z1}As$ second current confinement layer 9 having a thickness of 0.5 micrometers are formed in this order on the exposed surfaces of the p-type or i-type GaAs upper optical waveguide layer 5 and the n-type GaAs first current confinement layer 7, as illustrated in FIG. 11B, by changing gas in turn. Alternatively, the second etching stop layer 8 may be made of n-type $In_{x9}Ga_{1-x9}P$.

Thereafter, a resist is applied to the surface of the n-type $Al_{z1}Ga_{1-z1}As$ second current confinement layer 9, and an area of the resist corresponding to the current injection region is removed so as to expose a stripe area of the n-type $Al_{z1}Ga_{1-z1}As$ second current confinement layer 9 corresponding to the current injection region, as illustrated in FIG. 11C. Then, the exposed stripe area of the n-type $Al_{z1}Ga_{1-z1}As$ second current confinement layer 9 is etched with a solution of sulfuric acid and hydrogen peroxide as an etchant by using the remaining resist as a mask. At this time, the etching automatically stops at the upper boundary of the p-type $In_{x9}Ga_{1-x9}P$ second etching stop layer 8, and a stripe area of the p-type $In_{x9}Ga_{1-x9}P$ second etching stop layer 8 corresponding to the current injection region is exposed. Subsequently, the remaining resist is removed, and the exposed stripe area of the p-type $In_{x9}Ga_{1-x9}P$ second etching stop layer 8 is etched off with a hydrochloric acid etchant. At this time, the etching automatically stops at the upper boundary of the p-type or i-type GaAs upper optical waveguide layer 5, and a stripe area of the p-type or i-type GaAs upper optical waveguide layer 5 corresponding to the current injection region 20 is exposed. Thus, a groove for the current injection region 20 is formed as illustrated in FIG. 11C. That is, only the GaAs layer and the AlGaAs layer are exposed at the surface as a base of regrowth.

Finally, the temperature is raised in an arsenic atmosphere, and thereafter a p-type $Al_{z1}Ga_{1-z1}As$ upper cladding layer 10 and a p-type GaAs contact layer 11 are formed as illustrated in FIG. 11D. Then, a p electrode 12 is formed on the p-type GaAs contact layer 11. In addition, the exposed (opposite) surface of the substrate 1 is polished, and an n electrode 13 is formed on the polished surface of the substrate 1. Next, both ends of the layered construction are cleaved so as to form resonator surfaces, and a high reflectance coating and a low reflectance coating are provided on the respective resonator surfaces. Thereafter, the construction thus formed is further formed into a chip of a semiconductor laser element.

In the above process, an n-type or p-type GaAs cap layer may be formed after the n-type $Al_{z1}Ga_{1-z1}As$ second current confinement layer 9 is formed. The n-type or p-type GaAs cap layer can be etched off when the n-type $Al_{z1}Ga_{1-z1}As$ second current confinement layer 9 is etched.

CONCRETE EXAMPLE II

Hereinbelow, a concrete construction of the layers of the semiconductor laser element as the fourth embodiment and an example of a process for producing the concrete construction are explained below with reference to FIGS. 12A to 12D.

In organometallic vapor phase epitaxy used in the process explained below, trimethyl gallium (TMG), trimethyl indium (TMI), trimethyl aluminum (TMA), arsine, and phosphine are used as raw materials, silane gas is used as n-type dopant gas, and dimethyl zinc (DMZ) is used as p-type dopant gas.

Figure 12A:
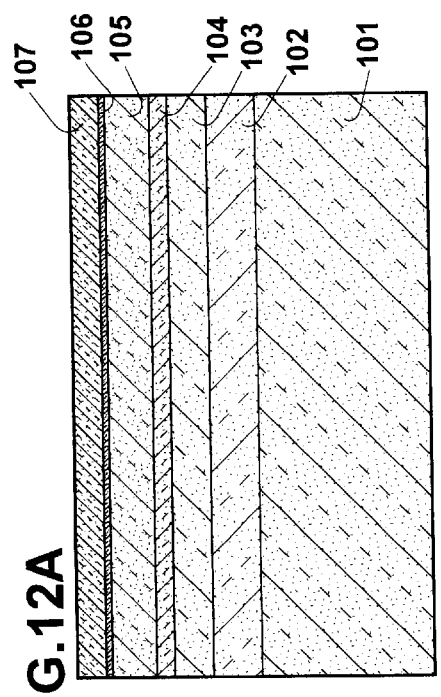
FIGS. 12A to 12D are cross-sectional views illustrating representative stages in a process for producing a semiconductor laser element as the fourth embodiment.

As illustrated in FIG. 12A, an n-type $Al_{z1}Ga_{1-z1}As$ lower cladding layer 102 ($0.57\leq z1\leq 0.8$), an n-type or i-type $In_{0.49}Ga_{0.51}P$ lower optical waveguide layer 103, an i-type $In_{x3}Ga_{1-x3}As_{1-y3}P_{y3}$ quantum-well active layer 104 ($0\leq x3\leq 0.4, 0\leq y3\leq 0.5$) having a thickness of about 5 to 20 nm, a p-type or i-type $In_{0.49}Ga_{0.51}P$ upper optical waveguide layer 105, a p-type $In_{x4}Ga_{1-x4}As_{1-y4}P_{y4}$ first etching stop layer 106 ($0\leq x4\leq 1$, $0\leq y4\leq 0.8$), and an n-type $In_{0.49}Ga_{0.51}P$ first current confinement layer 107 having a thickness of 0.5 micrometers are formed on a (001) face of an n-type GaAs substrate 101 by organometallic vapor phase epitaxy. When x3=0.2 and y3=0, the oscillation wavelength is 980 nm. When the composition of the active layer is varied, the oscillation wavelength can be controlled within a range of 700 to 1,200 nm.

Figure 12B:
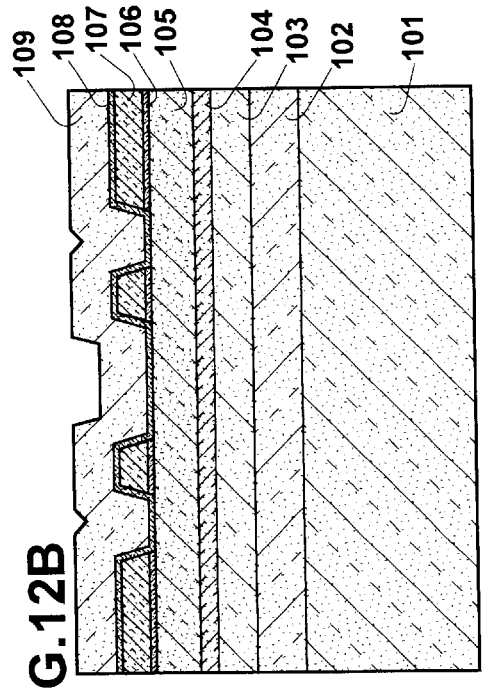

Next, as illustrated in FIG. 12B, a resist pattern which includes a center stripe opening and two side stripe openings is formed on the n-type $In_{0.49}Ga_{0.51}P$ first current confinement layer 107 by photolithography. The center stripe opening corresponds to a current injection region 120, and has a width of 6 micrometers. The side stripe openings each have a width of 3 micrometers, and are located on both sides of the center stripe opening and separated from the center stripe opening by 1.8 micrometers. The n-type $In_{0.49}Ga_{0.51}P$ first current confinement layer 107 is etched with a hydrochloric acid etchant by using the resist pattern as a mask. At this time, the etching automatically stops at the upper boundary of the p-type $In_{x4}Ga_{1-x4}As_{1-y4}P_{y4}$ first etching stop layer 106, and stripe areas of the p-type $In_{x4}Ga_{1-x4}As_{1-y4}P_{y4}$ first etching stop layer 106 corresponding to the above center and side stripe openings are exposed. Then, the above resist is removed, and the exposed stripe areas of the p-type $In_{x4}Ga_{1-x4}As_{1-y4}P_{y4}$ first etching stop layer 106 are etched with a solution of sulfuric acid and hydrogen peroxide as an etchant. At this time, the etching automatically stops at the upper boundary of the p-type or i-type $In_{0.49}Ga_{0.51}P$ upper optical waveguide layer 105. Therefore, stripe areas of the p-type or i-type $In_{0.49}Ga_{0.51}P$ upper optical waveguide layer 105 corresponding to the above center and side stripe openings are exposed. Subsequently, the temperature is raised in a phosphorus atmosphere, and thereafter an n-type $In_{x4}Ga_{1-x4}As_{1-y4}P_{y4}$ second etching stop layer 108 and an n-type $In_{0.49}(Al_{z2}Ga_{1-z2})_{0.51}P$ second current confinement layer 109 ($0.1 \leq z2 \leq 1$) having a thickness of 0.5 micrometers are formed on the exposed surfaces of the p-type or i-type $In_{0.49}Ga_{0.51}P$ upper optical waveguide layer 105 and the n-type $In_{0.49}Ga_{0.51}P$ first current confinement layer 107, as illustrated in FIG. 12B, by changing gas in turn.

Figure 12C:
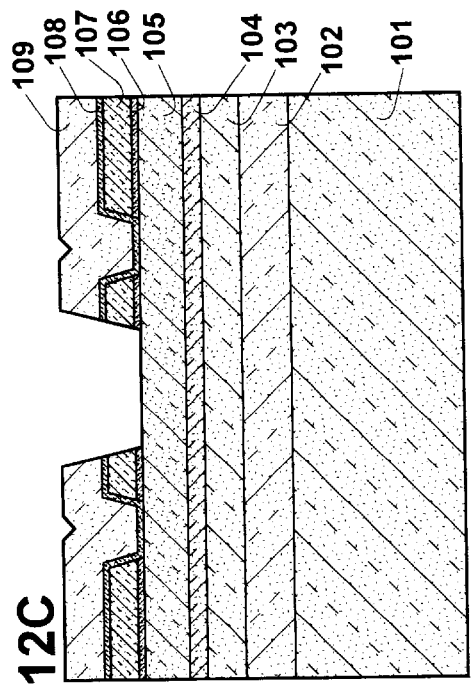

Thereafter, a resist is applied to the surface of the n-type $In_{0.49}(Al_{z2}Ga_{1-z2})_{0.51}P$ second current confinement layer 109, and an area of the resist corresponding to the current injection region is removed so as to expose a stripe area of the n-type $In_{0.49}(Al_{z2}Ga_{1-z2})_{0.51}P$ second current confinement layer 109 corresponding to the current injection region, as illustrated in FIG. 12C. Then, the exposed stripe area of the n-type $In_{0.49}(Al_{z2}Ga_{1-z2})_{0.51}P$ second current confinement layer 109 is etched with a hydrochloric acid etchant by using the remaining resist as a mask. At this time, the etching automatically stops at the upper boundary of the n-type $In_{x4}Ga_{1-x4}As_{1-y4}P_{y4}$ second etching stop layer 108, and a stripe area of the n-type $In_{x4}Ga_{1-x4}As_{1-y4}P_{y4}$ second etching stop layer 108 corresponding to the current injection region is exposed. Subsequently, the remaining resist is removed, and the exposed stripe area of the n-type $In_{x4}Ga_{1-x4}As_{1-y4}P_{y4}$ second etching stop layer 108 is etched with a solution of sulfuric acid and hydrogen peroxide as an etchant. At this time, the etching automatically stops at the upper boundary of the p-type or i-type $In_{0.49}Ga_{0.51}P$ upper optical waveguide layer 105, and a stripe area of the p-type or i-type $In_{0.49}Ga_{0.51}P$ upper optical waveguide layer 105 corresponding to the current injection region 120 is exposed. Thus, a groove for the current injection region 120 is formed as illustrated in FIG. 12C. That is, only the InGaP layer and the InGaAlP layer are exposed at the surface as a base of regrowth.

Figure 12D:
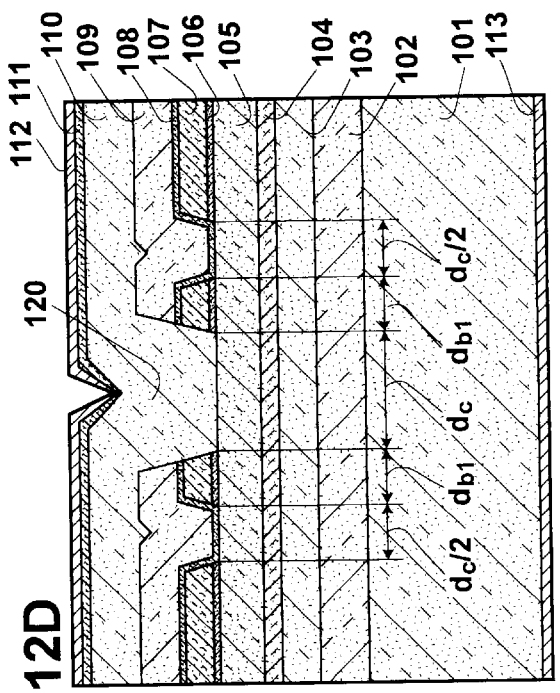

Finally, the temperature is raised in a phosphorus atmosphere, and thereafter a p-type $In_{0.49}(Al_{z2}Ga_{1-z2})_{0.51}P$ upper cladding layer 110 and a p-type GaAs contact layer 111 are formed as illustrated in FIG. 12D. Then, a p electrode 112 is formed on the p-type GaAs contact layer 111. In addition, the exposed (opposite) surface of the substrate 101 is polished, and an n electrode 113 is formed on the polished surface of the substrate 101. Next, both ends of the layered construction are cleaved so as to form resonator surfaces, and a high reflectance coating and a low reflectance coating are provided on the respective resonator surfaces. Thereafter, the construction thus formed is further formed into a chip of a semiconductor laser element.

Additional Matters (i) Each layer in the constructions of the first to sixth embodiments and their variations may be formed by molecular beam epitaxy using solid or gas raw material.

(ii) Although the constructions of the first to sixth embodiments and their variations are formed on the n-type GaAs substrates, instead, p-type GaAs substrates may be used. When the GaAs substrates are p-type, the conductivity types of all of the other layers in the constructions of the first to fourth embodiments should be inverted.

(iii) In the construction of each of the first to sixth embodiments and their variations, the active layer may have a multiple quantum-well structure.

(iv) In the construction of each of the fourth to sixth embodiments and their variations, it is possible to form barrier layers made of i-type $In_{x5}Ga_{1-x5}As_{1-y5}P_{y5}$ so that the active layer is sandwiched between the barrier layers, where $0 \leq x5 \leq 0.49y5$ and $0 \leq y5 \leq 0.4$, and the bandgaps of the barrier layers are greater than that of the active layer and smaller than that of $In_{0.49}Ga_{0.51}P$. In this case, carrier injection efficiency can be increased.

(v) Since the semiconductor laser elements according to the present invention are reliable even in high power operations, the semiconductor laser elements according to the present invention can be used as a light source in the fields of high-speed, information processing, image processing, communications, measurement, medicine, printing, and the like.

What is claimed is:

1. A semiconductor laser element comprising:
   a GaAs substrate of a first conductive type;
   a lower cladding layer formed above said GaAs substrate and made of $In_{0.49}Ga_{0.51}P$ or $Al_{z1}Ga_{1-z1}As$ of said first conductive type, where $0.2 \leq z1 \leq 0.8$;
   a lower optical waveguide layer formed above said lower cladding layer and made of GaAs which is undoped or said first conductive type;
   a compressive-strain quantum-well active layer formed above said lower optical waveguide layer and made of undoped $In_{x3}Ga_{1-x3}As_{1-y3}P_{y3}$, where $0.49y3 < x3 \leq 0.4$ and $0 \leq y3 \leq 0.1$;
   an upper optical waveguide layer formed above said compressive-strain quantum-well active layer and made of GaAs which is undoped or a second conductive type;
   a first etching stop layer made of $In_{x8}Ga_{1-x8}P$ of said second conductive type and formed above said upper optical waveguide layer other than stripe areas of the upper optical waveguide layer corresponding to at least one current injection region and low-refractive-index regions located on outer sides of the at least one current injection region and separated from the at least one current injection region or outermost ones of the at least one current injection region by a predetermined interval, where $0 \leq x8 \leq 1$, and said stripe areas extend in an oscillation direction of a laser resonator;
   a first current confinement layer made of GaAs of said first conductive type and formed above said first etching stop layer;
   a second etching stop layer made of $In_{x9}Ga_{1-x9}P$ of said first conductive type or said second conductive type and formed above said first current confinement layer and ones of said stripe areas of the upper optical waveguide layer corresponding to said low-refractive-index regions, where $0 \leq x9 \leq 1$;
   a second current confinement layer made of $Al_{z1}Ga_{1-z1}As$ of said first conductive type and formed above said second etching stop layer;
   an upper cladding layer made of $Al_{z1}Ga_{1-z1}As$ of said second conductive type and formed above said second current confinement layer and at least one of said stripe areas of the upper optical waveguide layer corresponding to said at least one current injection region; and a contact layer made of GaAs of said second conductive type and formed above said upper cladding layer.

2. A semiconductor laser element according to claim 1, further comprising a cap layer made of GaAs of said first conductive type or said second conductive type and formed on said second current confinement layer.

3. A semiconductor laser element according to claim 2, further comprising a GaAs layer of said second conductive type and formed between said first etching stop layer and said first current confinement layer.

4. A semiconductor laser element according to claim 3, further comprising an InGaAs quantum-well layer formed at a mid-thickness of said first current confinement layer, where the InGaAs quantum-well layer has a bandgap smaller than a bandgap of said active layer.

5. A semiconductor laser element according to claim 2, further comprising an InGaAs quantum-well layer formed at a mid-thickness of said first current confinement layer, where the InGaAs quantum-well layer has a bandgap smaller than a bandgap of said active layer.

6. A semiconductor laser element according to claim 1, further comprising a GaAs layer of said second conductive type and formed between said first etching stop layer and said first current confinement layer.

7. A semiconductor laser element according to claim 6, further comprising an InGaAs quantum-well layer formed at a mid-thickness of said first current confinement layer, where the InGaAs quantum-well layer has a bandgap smaller than a bandgap of said active layer.

8. A semiconductor laser element according to claim 1, further comprising an InGaAs quantum-well layer formed at a mid-thickness of said first current confinement layer, where the InGaAs quantum-well layer has a bandgap smaller than a bandgap of said active layer.

9. A process for producing a semiconductor laser element, comprising the steps of:

(a) forming above a GaAs substrate of a first conductive type a lower cladding layer made of $In_{0.49}Ga_{0.51}P$ or $Al_{z1}Ga_{1-z1}As$ of said first conductive type, where $0.2 \leq z1 \leq 0.8$;

(b) forming above said lower cladding layer a lower optical waveguide layer made of GaAs which is undoped or said first conductive type;

(c) forming above said lower optical waveguide layer a compressive-strain quantum-well active layer made of undoped $In_{x3}Ga_{1-x3}As_{1-y3}P_{y3}$, where $0.49y3 < x3 \leq 0.4$ and $0 \leq y3 \leq 0.1$;

(d) forming above said compressive-strain quantum-well active layer an upper optical waveguide layer made of GaAs which is undoped or a second conductive type;

(e) forming above said upper optical waveguide layer a first etching stop layer made of $In_{x8}Ga_{1-x8}P$ of said second conductive type, where $0 \leq x8 \leq 1$;

(f) forming above said first etching stop layer a first current confinement layer made of GaAs of said first conductive type;

(g) removing stripe regions of said first current confinement layer and said first etching stop layer so as to expose first stripe areas of said upper optical waveguide layer, where said first stripe areas correspond to at least one current injection region and low-refractive-index regions located on outer sides of the at least one current injection region and separated from the at least one current injection region or outermost ones of the at least one current injection region by a predetermined interval, and said first stripe areas extend in an oscillation direction of a laser resonator;

(h) raising temperature in an arsenic atmosphere;

(i) forming a second etching stop layer made of $In_{x9}Ga_{1-x9}P$ of said first conductive type or said second conductive type by regrowth above remaining areas of said first current confinement layer and said first stripe areas of the upper optical waveguide layer, where $0 \leq x9 \leq 1$;

(j) forming above said second etching stop layer a second current confinement layer made of $Al_{z1}Ga_{1-z1}As$ of said first conductive type;

(k) removing stripe regions of said second current confinement layer and said second etching stop layer so as to expose at least one second stripe area of said upper optical waveguide layer, where said at least one second stripe area corresponds to said at least one current injection region, and said at least one second stripe area extends in said oscillation direction of the laser resonator;

(l) raising the temperature in an arsenic atmosphere;

(m) forming an upper cladding layer made of $Al_{z1}Ga_{1-z1}As$ of said second conductive type by regrowth above remaining areas of said second current confinement layer and said at least one second stripe area of said upper optical waveguide layer; and (n) forming above said upper cladding layer a contact layer made of GaAs of said second conductive type.

10. A semiconductor laser element comprising:

a GaAs substrate of a first conductive type;

a lower cladding layer formed above said GaAs substrate and made of $Al_{z1}Ga_{1-z1}As$ or $In_{0.49}(Al_{z2}Ga_{1-z2})_{0.51}P$ of said first conductive type, where $0.57 \leq z1 \leq 0.8$ and $0.1 \leq z2 \leq 1$;

a lower optical waveguide layer formed above said lower cladding layer and made of $In_{0.49}Ga_{0.51}P$ which is undoped or said first conductive type;

a compressive-strain quantum-well active layer formed above said lower optical waveguide layer and made of undoped $In_{x3}Ga_{1-x3}As_{1-y3}P_{y3}$, where $0 \leq x3 \leq 0.4$ and $0 \leq y3 \leq 0.5$;

an upper optical waveguide layer formed above said compressive-strain quantum-well active layer and made of $In_{0.49}Ga_{0.51}P$ which is undoped or a second conductive type;

a first etching stop layer made of $In_{x4}Ga_{1-x4}As_{1-y4}P_{y4}$ of said first conductive type or said second conductive type and formed above said upper optical waveguide layer other than stripe areas of the upper optical waveguide layer corresponding to at least one current injection region and low-refractive-index regions located on outer sides of the at least one current injection region and separated from the at least one current injection region or outermost ones of the at least one current injection region by a predetermined interval, where $0 \leq x4 \leq 1$ and $0 \leq y4 \leq 0.8$, and said stripe areas extend in an oscillation direction of a laser resonator;

a first current confinement layer made of $In_{0.49}Ga_{0.51}P$ of said first conductive type and formed above said first etching stop layer;

a second etching stop layer made of $In_{x4}Ga_{1-x4}As_{1-y4}P_{y4}$ of said first conductive type and formed above said first current confinement layer and ones of said stripe areas of the upper optical waveguide layer corresponding to said low-refractive-index regions, where $0 \leq x4 \leq 1$ and $0 \leq y4 \leq 0.8$;

a second current confinement layer made of $In_{0.49}(Al_{z2}Ga_{1-z2})_{0.51}P$ of said first conductive type and formed above said second etching stop layer, where $0.1 \leq z2 \leq 1$;

an upper cladding layer made of $In_{0.49}(Al_{z2}Ga_{1-z2})_{0.5}P$ of said second conductive type or AlGaAs which has a refractive index approximately identical to a refractive index of said second current confinement layer, and formed above said second current confinement layer and at least one of said stripe areas of the upper optical waveguide layer corresponding to said at least one current injection region; and a contact layer made of GaAs of said second conductive type and formed above said upper cladding layer.

11. A semiconductor laser element according to claim 10, further comprising a cap layer made of $In_{0.49}Ga_{0.51}P$ of said first conductive type or said second conductive type and formed on said second current confinement layer.

12. A semiconductor laser element according to claim 11, further comprising an InGaAsP quantum-well layer formed at a mid-thickness of said first current confinement layer, where the InGaAsP quantum-well layer has a bandgap smaller than a bandgap of said active layer.

13. A semiconductor laser element according to claim 11, wherein each of said at least one current injection region has a width of 3 micrometers or greater.

14. A semiconductor laser element according to claim 13, further comprising an InGaAsP quantum-well layer formed at a mid-thickness of said first current confinement layer, where the InGaAsP quantum-well layer has a bandgap smaller than a bandgap of said active layer.

15. A semiconductor laser element according to claim 10, wherein each of said at least one current injection region has a width of 3 micrometers or greater.

16. A semiconductor laser element according to claim 15, further comprising an InGaAsP quantum-well layer formed at a mid-thickness of said first current confinement layer, where the InGaAsP quantum-well layer has a bandgap smaller than a bandgap of said active layer.

17. A semiconductor laser element according to claim 10, further comprising an InGaAsP quantum-well layer formed at a mid-thickness of said first current confinement layer, where the InGaAsP quantum-well layer has a bandgap smaller than a bandgap of said active layer.

18. A process for producing a semiconductor laser element, comprising the steps of:

(a) forming above a GaAs substrate of a first conductive type a lower cladding layer made of $Al_{z1}Ga_{1-z1}As$ or $In_{0.49}(Al_{z2}Ga_{1-z2})_{0.51}P$ of said first conductive type, where $0.57 \leq z1 \leq 0.8$ and $0.1 \leq z2 \leq 1$;

(b) forming above said lower cladding layer a lower optical waveguide layer made of $In_{0.49}Ga_{0.51}P$ which is undoped or said first conductive type;

(c) forming above said lower optical waveguide layer a compressive-strain quantum-well active layer made of undoped $In_{x3}Ga_{1-x3}As_{1-y3}P_{y3}$, where $0 \leq x3 \leq 0.4$ and $0 \leq y3 \leq 0.5$;

(d) forming above said compressive-strain quantum-well active layer an upper optical waveguide layer made of $In_{0.49}Ga_{0.51}P$ which is undoped or a second conductive type;

(e) forming above said upper optical waveguide layer a first etching stop layer made of $In_{x4}Ga_{1-x4}As_{1-y4}P_{y4}$ of said first conductive type or said second conductive type, where $0 \leq x4 \leq 1$ and $0 \leq y4 \leq 0.8$;

(f) forming above said first etching stop layer a first current confinement layer made of $In_{0.49}Ga_{0.51}P$ of said first conductive type;

(g) removing stripe regions of said first current confinement layer and said first etching stop layer so as to expose first stripe areas of said upper optical waveguide layer, where said first stripe areas correspond to at least one current injection region and low-refractive-index regions located on outer sides of the at least one current injection region and separated from the at least one current injection region or outermost ones of the at least one current injection region by a predetermined interval, and said first stripe areas extend in an oscillation direction of a laser resonator;

(h) raising temperature in a phosphorus atmosphere;

(i) forming a second etching stop layer made of $In_{x4}Ga_{1-x4}As_{1-y4}P_{y4}$ of said first conductive type by regrowth above remaining areas of said first current confinement layer and said first stripe areas of the upper optical waveguide layer;

(j) forming above said second etching stop layer a second current confinement layer made of $In_{0.49}(Al_{z2}Ga_{1-z2})_{0.51}P$ of said first conductive type;

(k) removing stripe regions of said second current confinement layer and said second etching stop layer so as to expose at least one second stripe area of said upper optical waveguide layer, where said at least one second stripe area corresponds to said at least one current injection region, and said at least one second stripe area extends in said oscillation direction of the laser resonator;

(l) raising the temperature in a phosphorus atmosphere;

(m) forming an upper cladding layer of said second conductive type made of $In_{0.49}(Al_{z2}Ga_{1-z2})_{0.51}P$ or AlGaAs which has a refractive index approximately identical to a refractive index of said second current confinement layer, by regrowth above remaining areas of said second current confinement layer and said at least one second stripe area of said upper optical waveguide layer; and (n) forming above said upper cladding layer a contact layer made of GaAs of said second conductive type.

* * * * *